United States Patent
Kouno et al.

(10) Patent No.: US 8,697,344 B2
(45) Date of Patent: *Apr. 15, 2014

(54) COMPOSITION FOR FORMING UPPER LAYER FILM FOR IMMERSION EXPOSURE, UPPER LAYER FILM FOR IMMERSION EXPOSURE, AND METHOD OF FORMING PHOTORESIST PATTERN

(71) Applicant: JSR Corporation, Tokyo (JP)

(72) Inventors: Daita Kouno, Tokyo (JP); Norihiko Sugie, Tokyo (JP); Gouji Wakamatsu, Tokyo (JP); Norihiro Natsume, Tokyo (JP); Yukio Nishimura, Tokyo (JP); Makoto Sugiura, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/854,214

(22) Filed: Apr. 1, 2013

(65) Prior Publication Data

US 2013/0216961 A1    Aug. 22, 2013

Related U.S. Application Data

(63) Continuation of application No. 12/680,200, filed as application No. PCT/JP2008/066351 on Sep. 10, 2008, now Pat. No. 8,431,332.

(30) Foreign Application Priority Data

Sep. 26, 2007   (JP) ................. 2007-250080

(51) Int. Cl.
*G03F 7/20*  (2006.01)
*G03F 7/11*  (2006.01)

(52) U.S. Cl.
USPC ......... 430/327; 430/273.1; 526/287; 525/200

(58) Field of Classification Search
None
See application file for complete search history.

(56) References Cited

U.S. PATENT DOCUMENTS 7,678,537 B2    3/2010  Allen et al.
8,431,332 B2 *  4/2013  Kouno et al. ................. 430/325

(Continued)

FOREIGN PATENT DOCUMENTS

EP    1806370     7/2007
JP    2006-047351  2/2006

(Continued)

OTHER PUBLICATIONS

English translation of JP, 2006-335916, A (2006) from machine translation from AIPN Japan Patent Office National Center for Industrial Property Information and Training, generated Feb. 18, 2014, 18 pages.*

(Continued)

*Primary Examiner* — Cynthia Hamilton
(74) *Attorney, Agent, or Firm* — Ditthavong Mori & Steiner, P.C.

(57) ABSTRACT

A composition for forming an upper layer film includes a solvent and a resin component including a first resin having a first repeating unit and a second repeating unit. The first repeating unit is a repeating unit represented by a formula (1-1), a repeating unit represented by a formula (1-2), a repeating unit represented by a formula (1-3), or a combination thereof. The second repeating unit is a repeating unit represented by a formula (2-1), a repeating unit represented by a formula (2-2), or both thereof. The composition is to be used for forming the upper layer film in liquid immersion lithography.

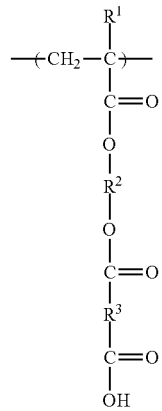

(1-1)

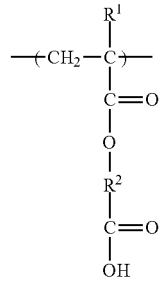

(1-2)

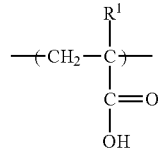

(1-3)

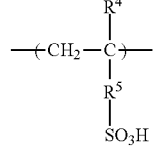

(2-1)

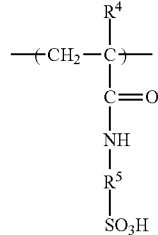

(2-2)

6 Claims, 2 Drawing Sheets

(56) References Cited

U.S. PATENT DOCUMENTS

| | | |
|---|---|---|
| 2006/0024613 A1 | 2/2006 | Otozawa et al. |
| 2008/0038661 A1 | 2/2008 | Chiba et al. |
| 2008/0311530 A1 | 12/2008 | Allen et al. |
| 2010/0021852 A1 | 1/2010 | Nishimura et al. |

FOREIGN PATENT DOCUMENTS

| | | |
|---|---|---|
| JP | 2006-335916 | 12/2006 |
| JP | 2007-024959 | 2/2007 |
| WO | WO 2006/035790 | 4/2006 |
| WO | WO 2008/047678 | 4/2008 |

OTHER PUBLICATIONS

Japanese Office Action for corresponding JP Application No. 2009-534267, Oct. 16, 2012.

Korean Office Action for corresponding KR Application No. 10-2010-7006497, Jan. 12, 2014.

\* cited by examiner

COMPOSITION FOR FORMING UPPER LAYER FILM FOR IMMERSION EXPOSURE, UPPER LAYER FILM FOR IMMERSION EXPOSURE, AND METHOD OF FORMING PHOTORESIST PATTERN

CROSS-REFERENCE TO RELATED APPLICATIONS

The present application is a continuation application of the U.S. patent application Ser. No. 12/680,200, which in turn is a national stage application of International Application No. PCT/JP2008/066351, filed Sep. 10, 2008, which claims priority to Japanese Patent Application No. 2007-250080, filed Sep. 26, 2007. The contents of these applications are incorporated herein by reference in their entirety.

BACKGROUND OF THE INVENTION

1. Field of the Invention

The present invention relates to a composition for forming an upper layer film for liquid immersion exposure, an upper layer film for liquid immersion exposure, and a method for the formation of a photoresist pattern.

2. Discussion of the Background

Semiconductor devices and the like are produced using a stepping or step-and-scan projection aligner which transfers a pattern of a reticle as a photomask onto each shot region on a wafer coated with a photoresist through a projection optical system.

The resolution of a projection optical system used in a projection aligner increases as the exposure wavelength decreases and the numerical aperture of the projection optical system increases. Therefore, the exposure wavelength (i.e., the wavelength of radiation used in the projection aligner) has decreased and the numerical aperture of the projection optical system has increased year by year as integrated circuits have been scaled down.

The depth of focus is as important as the resolution when a resist is exposed. Resolution R and depth of focus δ are expressed respectively by the following formulae. When obtaining the same resolution R, a larger depth of focus δ can be obtained using radiation with a shorter wavelength.

$$R = k_1 \cdot \lambda / NA \qquad (i)$$

$$\delta = k_2 \cdot \lambda / NA^2 \qquad (ii)$$

wherein λ is an exposure wavelength, NA is a numerical aperture of the projection optical system, and $k_1$ and $k_2$ are process coefficients.

In the above exposure technology, a photoresist film is formed on the surface of the exposure target wafer, and the pattern is transferred to the photoresist film. In a conventional projection aligner, the space in which the wafer is placed is filled with air or nitrogen.

When the space between the wafer and the lens of the projection aligner is filled with a medium having a refractive index of n, the resolution R and the depth of focus δ are represented by the following formulae.

$$R = k_1 \cdot (\lambda/n) / NA \qquad (iii)$$

$$\delta = k_2 \cdot n \lambda / NA^2 \qquad (iv)$$

For example, when water is used as the medium in an ArF process, the resolution R is 69.4% ($R = k_1 \cdot (\lambda/1.44)/NA$) and the depth of focus is 144% ($\delta = k_2 \cdot 1.44 \lambda / NA^2$) as compared with the case in which air or nitrogen is used as the medium, when the refractive index of light with a wavelength of 193 nm is n=1.44.

Such a projection exposure method in which the wavelength of radiation is reduced to transfer a more minute pattern is called liquid immersion lithography. The liquid immersion lithography is considered to be an essential technology for lithography with reduced dimensions, particularly for lithography with dimensions of several tens of nanometers. A projection aligner used for the method is also known in the art.

In the liquid immersion lithography using water as a medium of immersion, a photoresist film formed on a wafer and a lens of a projection aligner are brought into contact with water. For this reason, water may permeate the photoresist film and decrease resolution. In addition, photoresist components may elute into water and pollute the surface of the lens of the projection aligner.

A method of forming an upper layer film on a photoresist film in order to shut out the medium such as water has been proposed (see, JP-A 2007-24959 for example).

The upper layer film must exhibit sufficient transparency to the wavelength of radiation, must form a protective film on the photoresist film without being intermixed with the photoresist film, must maintain a stable covering effect without eluting components into a medium such as water used during liquid immersion lithography, and must be easily dissolved in an alkaline solution or the like as a developer.

The upper layer film commonly used in liquid immersion lithography is provided with water repellency to suppress a watermark defect which is a phenomenon of leaving a watermark having a size of 1 μm or larger on a resist pattern by preventing water drops from remaining on a protective film during exposure. The dissolution residue defects are more minute defects (dissolution residue defects with a size of 0.2 μm or smaller) and produced due to permeation of a small amount of water into a protective film even if water is prevented from remaining on the protective film. Specifically, water permeation reduces dissolution of a photoresist film and locally inhibits sufficient resolution of a pattern shape which should otherwise be resolved, resulting in pattern shape defects which are detected as dissolution residue defects.

SUMMARY OF THE INVENTION

According to one aspect of the present invention, a composition for forming an upper layer film includes a solvent and a resin component including a first resin having a first repeating unit and a second repeating unit. The first repeating unit is a repeating unit represented by a formula (1-1), a repeating unit represented by a formula (1-2), a repeating unit represented by a formula (1-3), or a combination thereof. The second repeating unit is a repeating unit represented by a formula (2-1), a repeating unit represented by a formula (2-2), or both thereof. The composition is to be used for forming the upper layer film in liquid immersion lithography.

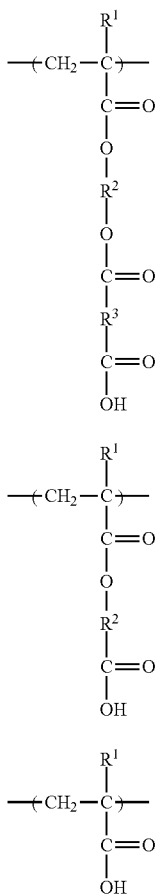

(1-1)

(1-2)

(1-3)

In the formulae (1-1) to (1-3), each $R^1$ individually is a hydrogen atom or a methyl group, each of $R^2$ and $R^3$ individually is a methylene group, a linear or branched alkylene group having 2 to 6 carbon atoms, or an alicyclic alkylene group having 4 to 12 carbon atoms,

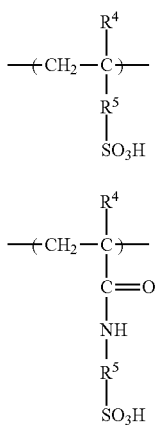

(2-1)

(2-2)

In the formulae (2-1) and (2-2), each $R^4$ individually is a hydrogen atom or a methyl group, and each $R^5$ individually is a single bond, a methylene group, or a linear or branched alkylene group having 2 to 6 carbon atoms.

According to another aspect of the present invention, an upper layer film in liquid immersion lithography is formed using the composition.

According to further aspect of the present invention, a method for forming a photoresist pattern includes applying a photoresist composition to a substrate to form a photoresist film. The composition for forming an upper layer film is applied to the photoresist film to form an upper layer film. A liquid immersion medium is disposed between the upper layer film and a lens. The photoresist film and the upper layer film are irradiated with exposure light through the liquid immersion medium and a mask having a specific pattern. The photoresist film is developed to obtain a photoresist pattern.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1:
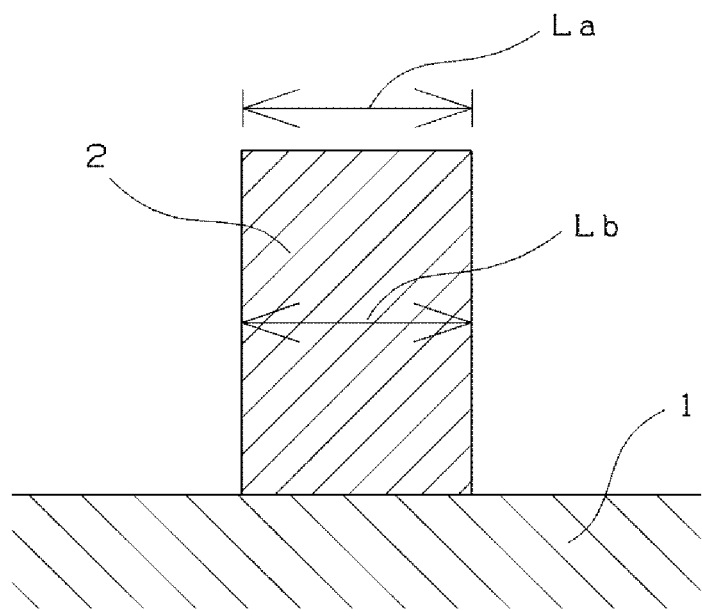
FIG. 1 is a cross-sectional view schematically showing the shape of a line-and-space pattern.

Embodiments of the present invention are as follows.
[1] A composition for forming an upper layer film in liquid immersion lithography including a resin component and a solvent, characterized in that the resin component includes a resin (A) having at least one repeating unit selected from a repeating unit represented by the following formula (1-1), a repeating unit represented by the following formula (1-2), and a repeating unit represented by the following formula (1-3), and at least one repeating unit selected from a repeating unit represented by the following formula (2-1) and a repeating unit represented by the following formula (2-2).

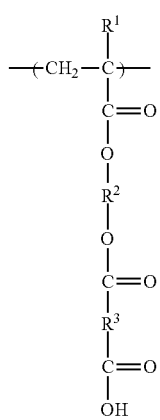

(1-1)

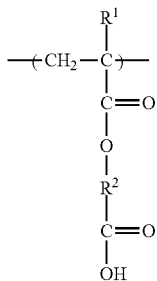
(1-2)

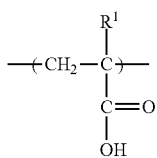
(1-3)

(In the general formulae (1-1) to (1-3), $R^1$ individually is a hydrogen atom or a methyl group, $R^2$ and $R^3$ individually are a methylene group, a linear or branched alkylene group having 2 to 6 carbon atoms, or an alicyclic alkylene group having 4 to 12 carbon atoms.)

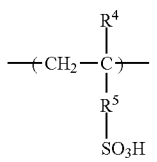
(2-1)

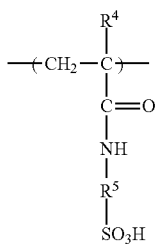
(2-2)

(In the general formulae (2-1) and (2-2), $R^4$ individually is a hydrogen atom or a methyl group, and $R^5$ individually is a single bond, a methylene group, or a linear or branched alkylene group having 2 to 6 carbon atoms.)

[2] The composition for forming an upper layer film in liquid immersion lithography according to [1] above, wherein the resin (A) forms a film having a receding contact angle with water of less than 60°.

[3] The composition for forming an upper layer film in liquid immersion lithography according to [1] or [2] above, wherein the resin component further includes a resin (B) having at least one repeating unit selected from a repeating unit represented by the following formula (3-1), a repeating unit represented by the following formula (3-2), and a repeating unit represented by the following formula (3-3), and a repeating unit represented by the following formula (4), the resin (B) forming a film having a receding contact angle with water of 65° or more.

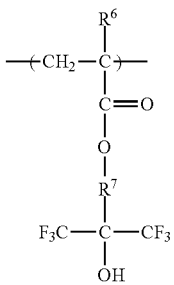
(3-1)

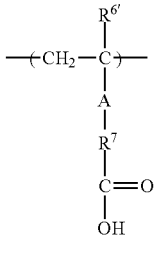
(3-2)

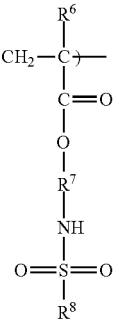
(3-3)

(In the general formulae (3-1) to (3-3), $R^6$ individually is a hydrogen atom, a methyl group, or a trifluoromethyl group, $R^{6'}$ is a linear or branched alkyl group having 1 to 3 carbon atoms with at least one hydrogen atom being substituted by a fluorine atom, $R^7$ individually is a single bond, a methylene group, a linear or branched alkylene group having 2 to 6 carbon atoms, or an alicyclic alkylene group having 4 to 12 carbon atoms, $R^8$ is a linear or branched alkyl group having 1 to 10 carbon atoms with at least one hydrogen atom being substituted by a fluorine atom or an alicyclic alkyl group having 3 to 10 carbon atoms with at least one hydrogen atom being substituted by a fluorine atom, and A represents a single bond, a carbonyl group, a carbonyloxy group, or an oxycarbonyl group.)

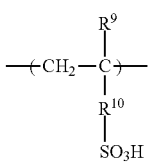
(4)

(In the general formula (4), $R^9$ is a hydrogen atom, a methyl group, or a trifluoromethyl group, and $R^{10}$ is a single bond, a methylene group, or a linear or branched alkylene group having 2 to 6 carbon atoms.)

[4] The composition for forming an upper layer film in liquid immersion lithography according to any one of [1] to [3]

above, wherein the resin (A) includes the repeating unit represented by the general formula (1-1) and the repeating unit represented by the general formula (2-1), and wherein the resin (B) includes the repeating unit represented by the general formula (3-1) and the repeating unit represented by the general formula (4-1).

[5] The composition for forming an upper layer film in liquid immersion lithography according to any one of [1] to [4] above, wherein the content of the resin (A) is in the range from 5% to 70% by weight based on 100% by weight of the total of the resin component.

[6] An upper layer film in liquid immersion lithography characterized in that the film is formed using the composition for forming an upper layer film in liquid immersion lithography according to any one of [1] to [5] above.

[7] A method for forming a photoresist pattern characterized by including:
(1) applying a photoresist composition to a substrate to form a photoresist film;
(2) applying the composition for forming an upper layer film in liquid immersion lithography according to any one of [1] to [5] above to the photoresist film to form an upper layer film; and
(3) disposing a liquid immersion medium between the upper layer film and a lens, irradiating the photoresist film and the upper layer film with exposure light through the liquid immersion medium and a mask having a specific pattern, and developing the photoresist film to obtain a photoresist pattern.

The composition for forming an upper layer film according to the embodiment of the present invention can sufficiently protect a photoresist in a liquid immersion lithographic process and is useful for forming an upper layer which protects a lens of a projection aligner by suppressing elution of a photoresist component. According to the composition for forming an upper layer film in liquid immersion lithography (hereinafter, referred to also as "composition for forming an upper layer film") of the embodiment of the present invention, the composition contains the resin (A) having excellent solubility in an alkaline developer, and being locally present at the interface between the photoresist film and the upper layer film, suppresses a decrease in solubility of the photoresist film in the developer and prevents dissolution residue defects due to water permeation. On the other hand, since the resin (B) with high water repellency is locally present on the surface of the protective film, watermark defects can be effectively prevented. In addition, the composition can form a film possessing sufficient transparency to light with a short wavelength (particularly 248 nm (KrF) and 193 nm (ArF)) on a photoresist film while causing almost no intermixing with the photoresist film, can be stably maintained without being dissolved in a medium such as water during liquid immersion lithography, can form a high resolution resist pattern while effectively suppressing defects such as watermark defects caused by liquid immersion lithography, and can suppress production of more minute defects.

The embodiments will now be described with reference to the accompanying drawings, wherein like reference numerals designate corresponding or identical elements throughout the various drawings.

In this specification, "(meth)acryl" means acryl and methacryl.

[1] Composition for Forming Upper Layer Film in Liquid Immersion Lithography

[Resin (A)]

The composition for forming an upper layer film of the embodiment of the present invention includes a resin (A) having at least one repeating unit selected from a repeating unit represented by the following general formula (1-1) (hereinafter, referred to as "repeating unit (1-1)"), a repeating unit represented by the following general formula (1-2) (hereinafter, referred to as "repeating unit (1-2)"), and a repeating unit represented by the following general formula (1-3) (hereinafter, referred to as "repeating unit (1-3)").

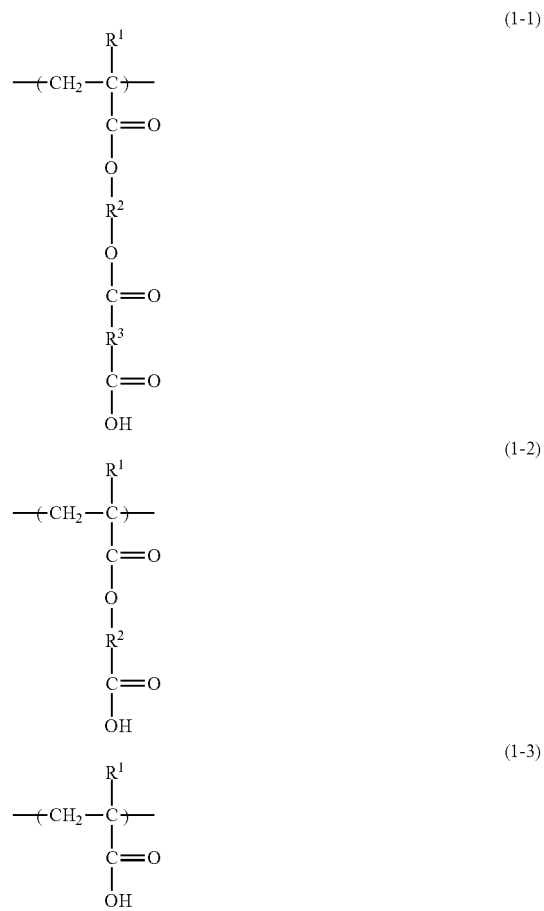

(In the general formulae (1-1) to (1-3), $R^1$ individually is a hydrogen atom or a methyl group, $R^2$ and $R^3$ individually are a methylene group, a linear or branched alkylene group having 2 to 6 carbon atoms, or an alicyclic alkylene group having 4 to 12 carbon atoms.)

Examples of the above-mentioned linear or branched alkylene group having 2 to 6 carbon atoms for $R^2$ and $R^3$ in the general formulae (1-1) and (1-2) include ethylene group, propylene group such as 1,3-propylene group and 1,2-propylene group, tetramethylene group, pentamethylene group, hexamethylene group, 1-methyl-1,3-propylene group, 2-methyl-1,3-propylene group, 2-methyl-1,2-propylene group, 1-methyl-1,4-butylene group, 2-methyl-1,4-butylene group, ethylidene group, propylidene group, 2-propylidene group and the like.

Additionally, examples of the alicyclic alkylene group having 4 to 12 carbon atoms for $R^2$ and $R^3$ include a monocyclic hydrocarbon ring group, a bridged cyclic hydrocarbon ring group and the like.

Examples of the monocyclic hydrocarbon ring group include an arylene group such as phenylene group and tolylene group, a cycloalkylene group having 4 to 12 carbon atoms including a cyclobutylene group such as 1,3-cyclobutylene group, a cyclopentylene group such as 1,3-cyclopentylene group, a cyclohexylene group such as 1,4-cyclohexylene group, a cyclooctylene group such as 1,5-cyclooctylene group, and the like.

In addition, examples of the bridged cyclic hydrocarbon ring group include a bi-cyclic to tetra-cyclic hydrocarbon ring group having 4 to 12 carbon atoms including a norbornylene group such as 1,4-norbornylene group and 2,5-norbornylene group, an adamantylene group such as 1,5-adamantylene group and 2,6-adamantylene group, and the like.

Examples of the monomer for forming the above-mentioned repeating unit (1-1) include 2-methacryloyloxyethyl hexahydrophthalate, 3-methacryloyloxypropyl hexahydrophthalate, 4-methacryloyloxybutyl hexahydrophthalate and the like.

Additionally, examples of the monomer for forming the above-mentioned repeating unit (1-2) include 2-methacryloyloxy cyclohexacarboxylate, 3-methacryloyloxy propylcarboxylate, and the like.

Further, examples of the monomer for forming the above-mentioned repeating unit (1-3) include (meth)acrylic acid.

The resin (A) further contains at least one repeating unit of a repeating unit represented by the following general formula (2-1) (hereinafter, referred to as "repeating unit (2-1)") and a repeating unit represented by the following general formula (2-2) (hereinafter, referred to as "repeating unit (2-2)"). At the interface between an unexposed photoresist film and a protective film, the protective film is dissolved in a developer during development, while the photoresist film is dispersed without being dissolved in the developer. As a result, the photoresist film component resin dispersed in the developer during a rinse process after development re-adheres to the photoresist film. When the repeating units (2-1) and (2-2) having strongly acidic groups are used, re-adhesion of the resin (BLOB defects; defect size: 0.2 μm or larger) after the rinse process can be prevented since the resin in the photoresist film is deprotected and dissolved in the developer.

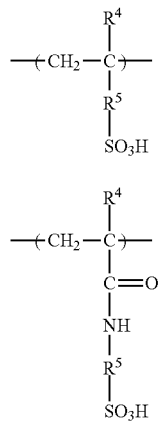

(In the general formulae (2-1) and (2-2), $R^4$ individually is a hydrogen atom or a methyl group, and $R^5$ individually is a single bond, a methylene group, or a linear or branched alkylene group having 2 to 6 carbon atoms.)

Description for $R^2$ in the above-mentioned general formula (1-1) applies to the linear or branched alkylene group having 2 to 6 carbon atoms for $R^5$ in the above-mentioned general formulae (2-1) and (2-2).

Additionally, examples of the monomer for the formation of the above-mentioned general formulae (2-1) and (2-2) include vinyl sulfonic acid, allyl sulfonic acid, 2-acrylamide-2-methyl-1-propane sulfonic acid, 4-vinyl-1-benzen sulfonic acid and the like.

For the above-mentioned the resin (A), there are no particular limitations to the combination of at least one of the repeating units (1-1) to (1-3) and at least one of the repeating units (2-1) and (2-2).

A combination of the repeating unit (1-1) and the repeating unit (2-1) is particularly preferred. In the case of this combination, re-adhesion of the resin after the rinse process can be prevented since the resin in the photoresist film is deprotected and dissolved in the developer.

In addition, the receding contact angle with water of the film formed from the resin (A) is preferably less than 60°, and more preferably less than 40°. The term "receding contact angle of a film with water" refers to a contact angle with water of a film having a thickness of 90 nm which is formed by spin-coating a 4-methyl-2-pentanol solution of the resin (A) on an 8-inch silicon wafer, and baking (PB) at a temperature of 90° C. for 60 seconds on a hot plate. The "receding contact angle" in the present specification refers to a contact angle between a liquid surface and a substrate on which the above-mentioned film is formed, when 25 μL of water is dropped on the substrate and thereafter suctioned at a rate of 10 μL/min. The receding contact angle can be measured using "DSA-10" manufactured by KRUS as described later in Examples.

[Resin (B)]

It is preferable in the embodiment of the present invention to further contain a resin (B) having at least one repeating unit selected from a repeating unit represented by the following formula (3-1) (hereinafter, referred to as "repeating unit (3-1)"), a repeating unit represented by the following formula (3-2) (hereinafter, referred to as "repeating unit (3-2)"), and a repeating unit represented by the following formula (3-3) (hereinafter, referred to as "repeating unit (3-3)"), and a repeating unit represented by the following formula (4) (hereinafter, referred to as "repeating unit (4)"), and capable of forming a film having a receding contact angle with water of 65° or more.

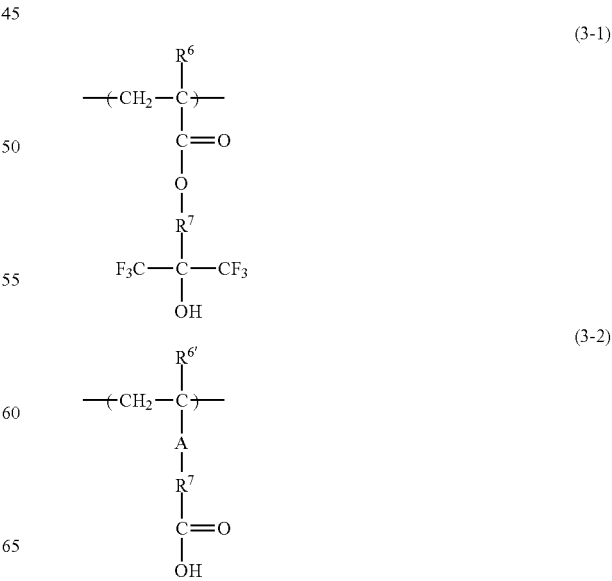

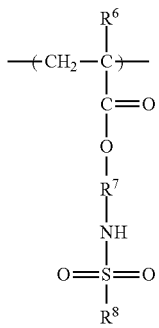

(In the general formulae (3-1) to (3-3), $R^6$ individually is a hydrogen atom, a methyl group, or a trifluoromethyl group, $R^{6'}$ is a linear or branched alkyl group having 1 to 3 carbon atoms with at least one hydrogen atom being substituted by a fluorine atom, $R^7$ individually is a single bond, a methylene group, a linear or branched alkylene group having 2 to 6 carbon atoms, or an alicyclic alkylene group having 4 to 12 carbon atoms, $R^8$ is a linear or branched alkyl group having 1 to 10 carbon atoms with at least one hydrogen atom being substituted by a fluorine atom or an alicyclic alkyl group having 3 to 10 carbon atoms with at least one hydrogen atom being substituted by a fluorine atom, and A represents a single bond, a carbonyl group, a carbonyloxy group, or an oxycarbonyl group.)

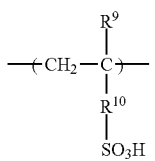

(In the general formula (4), $R^9$ is a hydrogen atom, a methyl group, or a trifluoromethyl group, and $R^{10}$ is a single bond, a methylene group, or a linear or branched alkylene group having 2 to 6 carbon atoms.)

Examples of the above-mentioned linear or branched alkyl group having 1 to 3 carbon atoms with at least one hydrogen atom being substituted by a fluorine atom for $R^{6'}$ in the general formula (3-2) include an alkyl group such as methyl group, ethyl group, propyl group and isopropyl group with at least one hydrogen atom being substituted by a fluorine atom, and the like.

In addition, description for $R^2$ in the above-mentioned general formula (1-1) applies to the linear or branched alkylene group having 2 to 6 carbon atoms and the alicyclic alkylene group having 4 to 12 carbon atoms for $R^7$ in the above-mentioned general formulae (3-1) to (3-3).

Moreover, examples of the above-mentioned linear or branched alkyl group having 1 to 10 carbon atoms with at least one hydrogen atom being substituted by a fluorine atom for $R^8$ in the general formula (3-3) include an alkyl group such as methyl group, ethyl group, propyl group, isopropyl group, butyl group, isobutyl group, sec-butyl group, tert-butyl group, pentyl group, isopentyl group, neopentyl group, hexyl group, heptyl group, octyl group, nonyl group and decyl group with at least one hydrogen atom being substituted by a fluorine atom, and the like.

Furthermore, examples of the above-mentioned cycloalkyl group having 3 to 10 carbon atoms with at least one hydrogen atom being substituted by a fluorine atom for $R^8$ include an alicyclic alkyl group such as cyclopropyl group, cyclobutyl group, cyclopentyl group, cyclohexyl group, cycloheptyl group, cyclooctyl group, cyclononyl group and cyclodecyl group with at least one hydrogen atom being substituted by a fluorine atom, and the like.

Examples of the monomer for forming the above-mentioned repeating unit (3-1) include (1,1,1-trifluoro-2-trifluoromethyl-2-hydroxy-3-propyl)(meth)acrylate, (1,1,1-trifluoro-2-trifluoromethyl-2-hydroxy-4-butyl)(meth)acrylate, (1,1,1-trifluoro-2-trifluoromethyl-2-hydroxy-5-pentyl)(meth)acrylate, (1,1,1-trifluoro-2-trifluoromethyl-2-hydroxy-4-pentyl)(meth)acrylate, 2-[[5-(1',1',1'-trifluoro-2'-trifluoromethyl-2'-hydroxy)propyl]bicyclo[2.2.1]heptyl](meth)acrylate, 3-[[8-(1',1',1'-trifluoro-2'-trifluoromethyl-2'-hydroxy)propyl]tetracyclo[6.2.1.1$^{3,6}$.0$^{2,7}$]dodecyl](meth)acrylate and the like.

Additionally, examples of the monomer for the formation of the above-mentioned repeating unit (3-2) include (monofluoromethyl) acrylate, (difluoromethyl) acrylate, (trifluoromethyl) acrylate, (monofluoroethyl) acrylate, (difluoroethyl) acrylate, (trifluoroethyl) acrylate, (tetrafluoroethyl) acrylate, (pentafluoroethyl) acrylate, and the like.

Further, examples of the monomer for the formation of the above-mentioned repeating unit (3-3) include [[(trifluoromethyl)sulfonyl]amino]ethyl-1-methacrylate, 2-[[(trifluoromethyl)sulfonyl]amino]ethyl-1-acrylate, a compound represented by the following formulae, and the like.

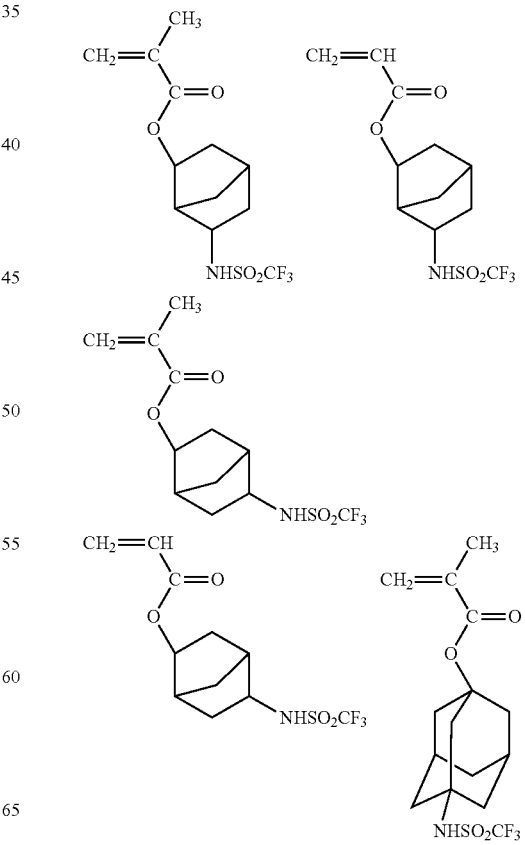

-continued

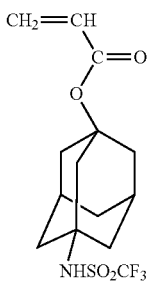

Additionally, description for $R^2$ in the above-mentioned general formula (1-1) applies to the linear or branched alkylene group having 2 to 6 carbon atoms for $R^{10}$ in the above-mentioned general formula (4).

Examples of the monomer for formation of the above-mentioned repeating unit (4) include vinyl sulfonic acid, allyl sulfonic acid, 2-acrylamide-2-methyl-1-propane sulfonic acid, 4-vinyl-1-benzen sulfonic acid and the like.

For the above-mentioned resin (B), there are no particular limitations to the combination of at least one of the repeating units (3-1) to (3-3) and the repeating unit (4).

A combination of the repeating unit (3-1) and the repeating unit (4) is particularly preferred. In the case of this combination, the high water repellency can prevent watermark defects due to water drop residue.

Additionally, the above-mentioned resin (B) is a resin having a receding contact angle of the film formed from the resin (B) with water of preferably 65° or more, and more preferably 69° or more. The term "receding contact angle of a film with water" refers to a contact angle with water of a film having a thickness of 90 nm which is formed by spin-coating a 4-methyl-2-pentanol solution of the resin (B) on an 8-inch silicon wafer, and baking (PB) at a temperature of 90° C. for 60 seconds on a hot plate.

In the case of containing the resin (B), the receding contact angle of the resin (A) with water may be lower than the receding contact angle of 65° or more of the resin (B) which has high water repellency. Therefore, the resin (B) can be caused to be locally present on the resin (A) in a mixture of the resin (A) and the resin (B), whereby it is possible to have their respective functions be shared. Specifically, the resin (B) having high water repellency which is caused to be locally present in the upper part of the upper layer film can maintain high receding contact angle of the resin mixture even if blended with the resin (A), whereby watermark defects due to water drop residue can be prevented. In addition, since the resin (A) has excellent solubility in an alkaline developer, local presence of the resin (A) in the lower part of the resin (B) (interface of the resist film and the upper layer film for liquid immersion) suppresses a decrease of solubility of the inter-mixing layer, thereby decreasing dissolution residue defects. For this reason, in addition to watermark defects, dissolution residue defects can be prevented.

[Other Resins]

In addition to the above-mentioned resin (A) and resin (B), the composition of the embodiment of the present invention may contain other resin (hereinafter, referred to as "other resin (C)").

Examples of the above-mentioned other resin (C) include a copolymer of (1,1,1,3,3,3-hexafluoro-2-propyl)methacrylate and (1,1,1-trifluoro-2-trifluoromethyl-2-hydroxy-4-pentyl) methacrylate, a copolymer of (2,2,2-trifluoroethyl)methacrylate and (1,1,1-trifluoro-2-trifluoromethyl-2-hydroxy-4-pentyl)methacrylate, and the like. These other resins (C) may be used singly or in combination of two or more types thereof.

In the case of containing the other resin (C) as the resin component, not only blob defects can be reduced, but also a receding contact angle of 72° or more which brings about high water repellency can be ensured.

The content of the above-mentioned resin (A) is preferably in the range from 5% to 70% by weight, and more preferably from 10% to 50% by weight based on 100% by weight of the total of the resin component. When the content is less than 5% by weight, a sufficient effect of preventing dissolution residue defects may not be obtained. On the other hand, when the content is more than 70% by weight, a high receding contact angle of the resin (B) having water repellency may not be maintained.

Additionally, the content of the above-mentioned resin (B) is preferably in the range from 20% to 95% by weight, and more preferably from 50% to 95% by weight based on 100% by weight of the total of the resin component. When the content is less than 20% by weight, a high receding contact angle of 69° cannot be maintained. On the other hand, when the content is more than 95% by weight, blob defects cannot be reduced.

Further, the content of the above-mentioned resin (C) is preferably in the range from 3% to 50% by weight, and more preferably from 3% to 10% based on 100% by weight of the total of the resin component. When the content is in the range from 3% to 50% by weight, a receding contact angle of 72° or more can be maintained.

Although the method for preparing the resins contained as the above-mentioned resin component is not particularly limited, such resins can be prepared by radical polymerization of one or more radically polymerizable corresponding monomers in a polymerization solvent in the presence of an appropriately selected initiator and chain transfer agent.

Examples of the above-mentioned polymerization solvent include an alcohol such as methanol, ethanol, 1-propanol, 2-propanol, 1-butanol, 2-butanol, ethylene glycol, diethylene glycol and propylene glycol; a cyclic ether such as tetrahydrofurane and dioxane; an alkyl ether of a polyhydric alcohol such as ethylene glycol mono methyl ether, ethylene glycol mono ethyl ether, ethylene glycol dimethyl ether, ethylene glycol diethyl ether, diethylene glycol mono methyl ether, diethylene glycol mono ethyl ether, diethylene glycol dimethyl ether, diethylene glycol diethyl ether, diethylene glycol ethyl methyl ether, propylene glycol mono methyl ether and propylene glycol mono ethyl ether; an alkyl ether acetate of a polyhydric alcohol such as ethylene glycol ethyl ether acetate, diethylene glycol ethyl ether acetate, propylene glycol ethyl ether acetate and propylene glycol mono methyl ether acetate; an aromatic hydrocarbon such as toluene and xylene; a ketone such as acetone, methyl ethyl ketone, methyl isobutyl ketone, cyclohexanone, 4-hydroxy-4-methyl-2-pentanone and diacetone alcohol; and an ester such as ethyl acetate, butyl acetate, methyl 2-hydroxypropionate, ethyl 2-hydroxy-2-methylpropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate and methyl 3-ethoxypropionate. Among these, a cyclic ether, a ketone, an ester and the like are preferable. These solvents may be used singly or in combination of two or more types thereof.

The weight average molecular weight (hereinafter, referred to also as "Mw") of each resin contained as the resin component is preferably in the range from 2,000 to 100,000, more preferably from 2,500 to 50,000, and further preferably from 3,000 to 20,000. When the Mw is less than 2,000, water resistance and mechanical characteristics as an upper layer film may be unduly reduced. On the other hand, when the Mw is more than 100,000, solubility in the above-mentioned solvent may be significantly decreased.

Additionally, the ratio (Mw/Mn) of the Mw to the number average molecular weight (hereinafter, referred to also as "Mn") for each resin is preferably in the range from 1 to 5, and more preferably from 1 to 3. The weight average molecular weight and the number average molecular weight herein refer to polystyrene-reduced values determined by gel permeation chromatography (GPC).

It is preferable for the resin such as the resin (A) and resin (B) to contain impurities such as halogens and metals in an amount as small as possible. Applicability as an upper layer film and uniform solubility in an alkaline developer can be improved by reducing the amount of impurities.

Further, examples of the method for purification of the resin such as the resin (A) and resin (B) include a chemical purification method including washing with water, liquid-liquid extraction and the like; a combining method of a chemical purification method and a physical purification method including ultrafiltration, centrifugation and the like; and the like.

The resin such as the resin (A) and resin (B) must not only form an upper layer film (protective film) which is stable in a liquid immersion medium such as water used while irradiating radiation, but also must be dissolved in a developer used for forming a resist pattern. The term "stable in a liquid immersion medium" refers to the properties of a resin showing a film thickness change determined by the "stability evaluation test" shown below of 3% or less of the initial thickness.

<Stability Evaluation Test>
(i) Apply a composition for forming an upper layer film (solution prepared by dissolving a resin component in a solvent) to an 8-inch silicon wafer by spin-coating with a coater/developer (1) "CLEAN TRACK ACT8" (type name) manufactured by Tokyo Electron limited, and pre-bake (PB) the coating at a temperature of 90° C. for 60 seconds to form an upper layer film having a thickness of 90 nm. Measure the initial thickness of the resulting upper layer film using an optical interference thickness meter "LAMBDA ACE VM-2010" (type name) manufactured by Dainippon Screen Mfg. Co., Ltd.
(ii) Inject ultra-pure water for 60 seconds from a rinse nozzle of the coater/developer (1) onto the surface of the wafer on which the upper layer film has been formed, followed by spin-drying at 4,000 rpm for 15 seconds. Measure the thickness of the resulting upper layer film again to determine the thickness change (thickness reduction) of the upper layer film. A film exhibiting a thickness reduction of 3% or less of the initial thickness is evaluated to be "stable in a liquid immersion medium".

The term "soluble in a developer after forming a resist pattern" used herein refers to the capability of an upper layer film of being removed without leaving a residue observable with the naked eye on the surface of a resist pattern after development using an alkaline aqueous solution. That is, the resin component such as the resin (A) and resin (B) included in the composition for forming an upper layer film of the embodiment of the present invention is an alkali-soluble resin which is scarcely dissolved in a medium such as water, but is dissolved in an alkaline aqueous solution during development using the alkaline aqueous solution after irradiation.

The upper layer film formed by the composition for forming an upper layer film containing such a resin component can prevent a photoresist film from directly coming in contact with a medium such as water during liquid immersion exposure, prevents deterioration of lithographic performance of the photoresist film due to penetration of the medium, and protects the lens of the projection aligner from being polluted with components eluted from the photoresist film.

The weight ratio (resin (A)/resin (B)) between the resin (A) and the resin (B) is preferably 0.05 or more, more preferably in the range from 0.05 to 2.33, and further preferably from 0.10 to 1.00. When the weight ratio is less than 0.05, a sufficient effect on dissolution residue defects may not be obtained. On the other hand, when the weight ratio exceeds 2.33, it becomes impossible to maintain the receding contact angle of the resin (B) which has high water repellency. There is also a possibility that the upper layer film cannot withstand a high scanning speed.

In addition, the composition for forming an upper layer film of the embodiment of the present invention further includes a solvent to dissolve the resin such as the resin (A) and resin (B).

A solvent exhibiting almost no adverse effect on the lithographic performance such as intermixing with the photoresist film when applied to the photoresist film can be preferably used.

Examples of the solvent include a monohydric alcohol, a polyhydric alcohol, an alkyl ether of a polyhydric alcohol, an alkyl ether acetate of a polyhydric alcohol, an ether, a cyclic ether, a higher hydrocarbon, an aromatic hydrocarbon, a ketone, an ester, water, and the like.

Examples of the above-mentioned monohydric alcohol include a monohydric alcohol having 4 to 10 carbon atoms such as 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-1-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol and cyclohexanol.

Examples of the above-mentioned polyhydric alcohol include ethylene glycol, propylene glycol and the like.

Examples of the above-mentioned alkyl ether of a polyhydric alcohol include ethylene glycol mono methyl ether, ethylene glycol mono ethyl ether, ethylene glycol dimethyl ether, ethylene glycol diethyl ether, diethylene glycol mono methyl ether, diethylene glycol mono ethyl ether, diethylene glycol dimethyl ether, diethylene glycol diethyl ether, diethylene glycol ethyl methyl ether, propylene glycol mono methyl ether, propylene glycol mono ethyl ether and the like.

Examples of the above-mentioned alkyl ether acetate of a polyhydric alcohol include ethylene glycol ethyl ether acetate, diethylene glycol ethyl ether acetate, propylene glycol ethyl ether acetate, propylene glycol mono methyl ether acetate and the like.

Examples of the above-mentioned ether include dipropyl ether, diisopropyl ether, butyl methyl ether, butyl ethyl ether, butyl propyl ether, dibutyl ether, diisobutyl ether, tert-butyl methyl ether, tert-butyl ethyl ether, tert-butyl propyl ether, di-tert-butyl ether, dipentyl ether, diisoamyl ether, cyclopentyl methyl ether, cyclohexyl methyl ether, cyclopentyl ethyl ether, cyclohexyl ethyl ether, cyclopentyl propyl ether, cyclopentyl 2-propyl ether, cyclohexyl propyl ether, cyclohexyl 2-propyl ether, cyclopentyl butyl ether, cyclopentyl tert-butyl ether, cyclohexyl butyl ether, cyclohexyl tert-butyl ether and the like. Examples of the above-mentioned cyclic ether include tetrahydrofurane, dioxane and the like.

Examples of the above-mentioned higher hydrocarbon include decane, dodecane, undecane and the like.

Examples of the above-mentioned aromatic hydrocarbon include benzene, toluene, xylene and the like.

Examples of the above-mentioned ketone include acetone, methyl ethyl ketone, methyl isobutyl ketone, cyclohexanone, 4-hydroxy-4-methyl-2-pentanone, diacetone alcohol and the like.

Examples of the above-mentioned ester include ethyl acetate, butyl acetate, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate and the like.

Among these solvents, a monohydric alcohol, an ether, a cyclic ether, an alkyl ether of a polyhydric alcohol, an alkyl ether acetate of a polyhydric alcohol and a higher hydrocarbon are preferable. Particularly, a solvent containing an alcohol having 4 to 10 carbon atoms and/or an alkyl ether including an alkyl chain having 4 to 10 carbon atoms is preferred.

Additionally, a surfactant may be further incorporated into the composition for forming an upper layer film of the embodiment of the present invention for the purpose of improving the coatability, defoamability, leveling performance and the like.

As the above-mentioned surfactant, a fluorine-based surfactant including commercial products such as "BM-1000" and "BM-1100" manufactured by BM-Chemie, "Megafak F142D", "Megafak F172", "Megafak F173" and "Megafak F183" manufactured by Dainippon ink and chemicals Inc., "Fluorad FC-135", "Fluorad FC-170C", "Fluorad FC-430" and "Fluorad FC-431" manufactured by Sumitomo 3M Ltd., "Surfron S-112", "Surfron 5-113", "Surfron S-131" and "Surfron S-141" manufactured by Asahi glass Co., Ltd., "SH-28PA", "SH-190", "SH-193", "SZ-6032" and "SF8428" manufactured by Dow Corning Toray Co., Ltd., and "EMULGEN A-60", "EMULGEN 104P" and "EMULGEN 306P" manufactured by Kao Corp. can be used. The surfactant may be used singly or in combination of two or more types thereof.

The formulating amount of the surfactant is preferably 5 parts or less by weight based on 100 parts by weight of the total of the resin (A) and resin (B).

The composition for forming an upper layer film can be prepared by filtering a solution of which the total solid content has been adjusted to become a desired value through a filter with a pore size of about 200 nm. The solid content is not particularly limited and may be controlled as necessary. The solid content of the composition for forming an upper layer film is usually in the range from 0.1% to 20% by weight.

[2] Upper Layer Film in Liquid Immersion Lithography

The upper layer film in liquid immersion lithography of the embodiment of the present invention (hereinafter, referred to also as "upper layer film") is characterized in that the film is made from a composition for forming an upper layer film in liquid immersion lithography. Since this upper layer film can effectively suppress defects inherent to liquid immersion lithography such as watermark defects and dissolution residue defects, the film can be suitably used in liquid immersion lithography. The above description can be applied to the "composition for forming an upper layer film in liquid immersion lithography".

The upper layer film in liquid immersion lithography may be formed by applying the above-mentioned composition for forming an upper layer film in liquid immersion lithography to a target such as a resist film using a known coating method such as rotational coating, cast coating and roll coating. When the upper layer film is formed, the applied composition may be prebaked (hereinafter, referred to also as "PB") in order to vaporize the solvent.

The thickness of the upper layer film is not particularly limited and may be variously changed as required.

[3] Method for Forming Photoresist Pattern

The method for forming a photoresist pattern using the composition for forming an upper layer film of the embodiment of the present invention may include (1) applying a photoresist composition to a substrate to form a photoresist film [step (1)], (2) applying the composition for forming an upper layer film in liquid immersion lithography to the photoresist film to obtain an upper layer film [step (2)], and (3) disposing a liquid immersion medium between the upper layer film and a lens, irradiating the photoresist film and the upper layer film with exposure light through the liquid immersion medium and a mask having a specific pattern, and developing the photoresist film to obtain a photoresist pattern [step (3)].

According to this method, an upper layer film having sufficient transparency to a short exposure wavelength (particularly 248 nm (KrF) and 193 nm (ArF)), and causing almost no intermixing with a photoresist film can be formed on the photoresist film. It is also possible to form a high resolution resist pattern having a stable film of which the components are extremely difficult to elute in an immersion medium such as water during liquid immersion lithography.

The above-mentioned step (1) is a process in which a photoresist composition is applied to a substrate to form a photoresist film.

The above-mentioned substrate may be a silicon wafer, a silicon wafer coated with aluminum, and the like. In one preferred embodiment, an organic or inorganic antireflection film is previously formed on the surface of the substrate in order to bring out the potential of the photoresist film to the maximum extent (See, for example JP-B H6-12452).

There are no particular limitations to the type of substance on which the photoresist film is formed. The substance may be suitably selected from those generally used for forming photoresist films according to the purpose of use of the resist, provided that a chemically amplified resist material containing an acid generator, particularly a positive-tone resist material, is preferably used.

Examples of the chemically amplified positive-tone resist material include a photosensitive resin composition containing an alkali-soluble resin modified with an acid-dissociable group and an acid generator as essential components, and the like. Such a resin composition generates an acid from the acid generator by irradiation (exposure). An acid-dissociable group which protects an acidic group (such as a carboxyl group) of the resin is dissociated by the action of the generated acid and the acidic group is caused to be exposed. As a result of exposure of an acidic group, the area on the resist exposed to radiation acquires increased alkali solubility and is dissolved in an alkaline developer, and removed to form a positive-tone resist pattern.

Additionally, when the photoresist composition contains an acid-dissociable group-containing resin and an acid generator, it is preferable that the above-mentioned resin has an acid-dissociable group-containing repeating unit in an amount of 40% to 60% by mol based on the total amount of the repeating units of the resin. When the content of the repeating unit is less than 40% by mol, resolution as a resist may be impaired. When the content of this repeating unit is more than 60% by mo %, the thickness of the resist after removing the upper layer film may be unduly reduced.

Examples of the resin include (i) a resin having the following repeating unit (M-1), the following repeating unit (M-2), and the following repeating unit (M-3); (ii) a resin having the following repeating unit (M-1), the following repeating unit (M-2), and the following repeating unit (M-4); and (iii) a resin having the following repeating unit (M-1), the following repeating unit (M-3), and the following repeating unit (M-5); and the like.

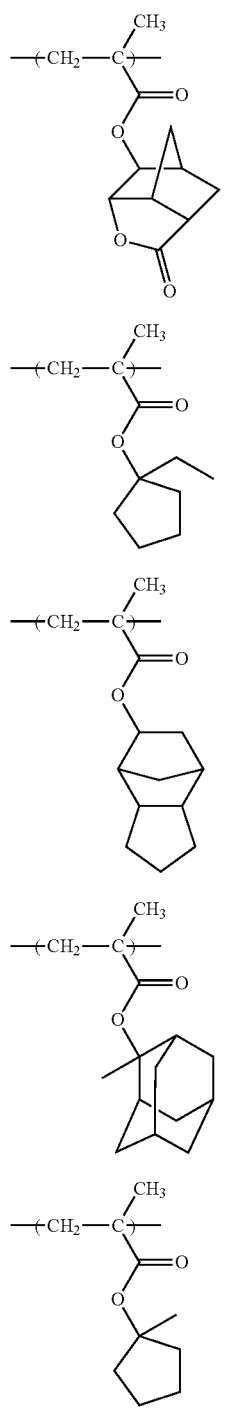

In addition, the acid generator is a compound which generates an acid upon irradiation (exposure). The generated acid dissociates an acid-dissociable group which has been protecting an acidic group such as carboxyl group in the resin to expose the acidic group.

Examples of the acid generator include triphenylsulfonium nonafluoro-n-butanesulfonate, 4-cyclohexylphenyl diphenylsulfonium nonafluoro-n-butanesulfonate, 1-(4-n-butoxynaphthalen-1-yl)tetrahydrothiophenium nonafluoro-n-butanesulfonate, triphenylsulfonium 2-(bicyclo[2.2.1]hept-2'-yl)-1,1,2,2-tetrafluoroethanesulfonate, 1-(4-n-butoxynaphthyl)tetrahydrothiophenium 2-(bicyclo[2.2.1]hept-2'-yl)-1,1,2,2-tetrafluoroethanesulfonate, triphenylsulfonium 2-(bicyclo[2.2.1]hept-2'-yl)-1,1-difluoroethanesulfonate, and the like.

The acid generator may be used singly or in combination of two or more types thereof.

The above-mentioned photoresist composition solution (coating solution) can be prepared by adding a solvent to a resin component which forms a photoresist film to make a solution with a solid content of 0.2% to 20% by weight and filtering the solution through a filter having a pore size of about 30 nm. The coating solution may be prepared by a user or a commercially available resist solution may be used.

The photoresist film may be formed by applying the coating solution onto a substrate using a generally known coating method such as spin coating, cast coating and roll coating. When the photoresist film is formed, the applied coating solution may be prebaked (hereinafter, referred to as "PB") in order to vaporize the solvent.

The above-mentioned step (2) is a process in which the composition for forming an upper layer film is coated onto the surface of the photoresist film formed in the above-mentioned step (1) and the coated film is preferably baked again to form an upper layer film. The above description can be applied as is to the "composition for forming an upper layer film".

When the upper layer film is formed in this manner, it is possible to prevent direct contact of a photoresist film with a medium used for liquid immersion exposure, whereby deterioration of lithographic performance of the photoresist film due to penetration of the medium and pollution of a lens of the projection aligner with components eluted from the photoresist film can be prevented.

Additionally, the thickness of the upper layer film is preferably as close as possible to an anisoploid of λ/4 m (wherein λ is a wavelength of radiation and m is a refractive index of the protective film) since the closer the thickness to the anisoploid of λ/4 m, the greater the antireflection effect on the upper side surface of the photoresist film.

The above-mentioned step (3) is a process in which a liquid immersion medium is disposed between the upper layer film and a lens, the photoresist film and the upper layer film are subjected to irradiation with exposure light through the liquid immersion medium and a mask having a specific pattern, and the photoresist film is subjected to development to obtain a resist pattern.

The immersion medium is usually a liquid having a refractive index higher than air. Water is preferably used, with ultra-pure water being particularly preferable. The pH of the immersion liquid may be adjusted as required.

When the exposure in liquid immersion lithography is carried out, the photoresist film is exposed through a mask having a specified pattern in a condition in which a liquid medium is filled between the lens of the photolithography machine and the photoresist film.

As the radiation used for the liquid immersion lithography, various types of radiation such as visible light; ultraviolet rays such as g-line and i-line; deep ultraviolet rays such as an excimer laser light; X-rays such as synchrotron radiation; and charged particle rays such as electron beams may be appropriately selected according to the photoresist film and the type of upper layer film. Among these, an ArF excimer laser (wavelength; 193 nm) and a KrF excimer laser (wavelength; 248 nm) are preferably used.

The exposure conditions such as an amount of radiation are appropriately determined according to the composition of the radiation-sensitive resin composition, types of additives, and the like.

Additionally, In order to improve the resolution, pattern shape, developability and the like of the photoresist film, it is preferred that baking (PEB) is performed after the exposure. The baking temperature therefor is appropriately adjusted in accordance with the radiation-sensitive resin composition, and others. The temperature is usually in the range from 30° C. to 200° C., and preferably from 50° C. to 150° C.

After exposure or PEB, the photoresist is developed and washed as required, to form a desired photoresist pattern.

The upper layer film can be formed using the composition for forming an upper layer film of one embodiment of the present invention. The upper layer film can be easily removed during development or washing after the development without separately adding a step of delaminating the upper layer film. An alkaline developer is usually used for the development.

The above-mentioned developer is preferably used an alkaline aqueous solution prepared by dissolving at least one an alkaline compound such as sodium hydroxide, potassium hydroxide, sodium carbonate, sodium silicate, sodium metasilicate, ammonia, ethyl amine, n-propyl amine, diethyl amine, di-n-propyl amine, triethyl amine, methyl diethyl amine, dimethyl ethanol amine, triethanol amine; a tetraalkyl ammonium hydroxide such as tetramethyl ammonium hydroxide and tetraethyl ammonium hydroxide; pyrrole, piperidine, choline, 1,8-diazabicyclo-[5.4.0]-7-undecene and 1,5-diazabicyclo-[4.3.0]-5-nonane. Among these, an aqueous solution of the tetraalkyl ammonium hydroxide is preferably used.

Additionally, the developer may further contain an appropriate amount of a water-soluble organic solvent such as methanol and ethanol, a surfactant and the like.

In the case of developing using the above-mentioned alkaline solution, rinsing is usually carried out after developing. Further, when drying is carried out after developing or rinsing as required, a desired photoresist pattern can be obtained.

EXAMPLES

Hereinafter, the embodiments of the present invention are described in detail. In addition, "part" and "%" in the examples are based on weight unless otherwise indicated.
[1] Preparation of Radiation-Sensitive Resin Composition (α) to (γ)
(1-1) Resins (α-1) to (α-3) for radiation-sensitive resin composition Resins (α-1) to (α-3) for radiation-sensitive resin composition used to prepare a radiation-sensitive resin composition for forming a photoresist film were synthesized as follows.

Synthesis Example 1

A monomer solution was prepared by dissolving 53.93 g (50% by mol) of a compound for forming the following repeating unit (M-1), 35.38 g (40% by mol) of a compound for forming the following repeating unit (M-2), and 10.69 g (10% by mol) of a compound for forming the following repeating unit (M-3) in 200 g of 2-butanone, and further adding 5.58 g of dimethyl-2,2'-azobis(2-methylpropionate). On the other hand, a 500 ml three-necked flask equipped with a thermometer and a dropping funnel was charged with 100 g of 2-butanone and purged with nitrogen gas for 30 minutes. After nitrogen purge, the content in the flask was heated to a temperature of 80° C. under stirring with a magnetic stirrer. The previously prepared monomer solution was added into the flask using a dropping funnel over three hours. The polymerization reaction was carried out for six hours after initiation of dropping. After the termination of the polymerization, the polymer solution was cooled with water to a temperature of 30° C. or lower and was poured into 2,000 g of methanol. Then a white precipitate was collected by filtration and the white powder in a state of slurry was washed twice with 400 g of methanol. After that, filtration and drying at a temperature of 50° C. for 17 hours were carried out to obtain a white powdery copolymer (74 g, yield: 74%).

Mw of the copolymer was 6,900 and the ratio Mw/Mn was 1.70. As a result of $^{13}$C-NMR analysis, the copolymer was found to have the repeating units (M-1), (M-2), and (M-3) in a ratio of 53.0:37.2:9.8 (% by mol), and the content of the repeating unit containing an acid-dissociable group was 37.2% by mol. The copolymer is referred to as a resin (α-1) for radiation-sensitive resin composition.

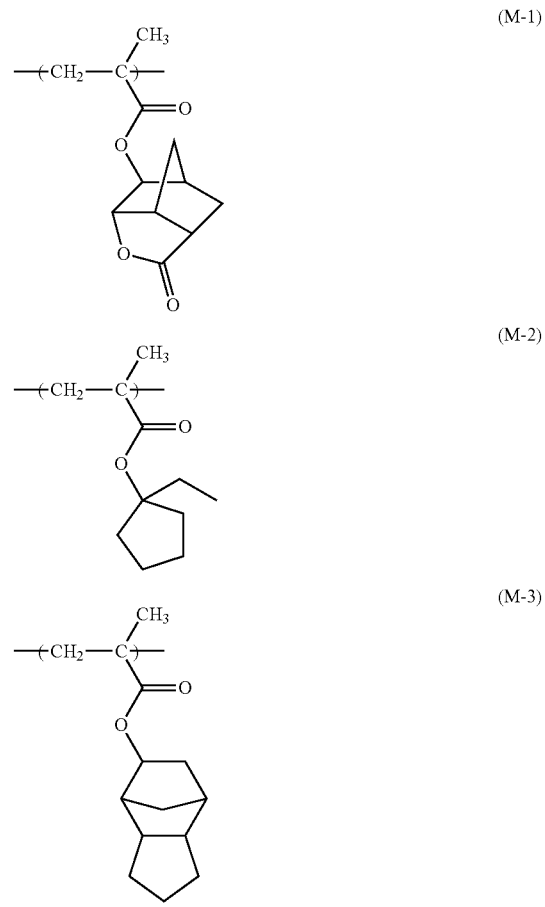

Measurement and evaluation in Synthesis Examples were carried out according to the methods as follows. Those of Synthesis Examples described below are the same.

<Mw and Mn>

These were measured by gel permeation chromatography (GPC) with monodispersed polystyrene as a standard reference material using high speed GPC apparatus "HLC-8120" (type name) manufactured by Tosoh Corp. including GPC column ("G2000HXL"×2, "G3000HXL"×1, "G4000HXL"×1) manufactured by Tosoh Corp. under the following analysis conditions. Flow rate: 1.0 ml/min., eluate: tetrahydrofuran, column temperature: 40° C. Dispersibility Mw/Mn was calculated from the measurement result.

<$^{13}$C-NMR Analysis>

$^{13}$C-NMR analysis of the polymer was carried out using "JNM-EX270" manufactured by JEOL Ltd.

Synthesis Example 2

A monomer solution was prepared by dissolving 47.54 g (46% by mol) of a compound for forming the following repeating unit (M-1), 12.53 g (15% by mol) of a compound for forming the following repeating unit (M-2), and 39.93 g (39% by mol) of a compound for forming the following repeating unit (M-4) in 200 g of 2-butanone, and further adding 4.08 g of 2,2'-azobis(isobutylonitrile). On the other hand, a 1,000 ml three-necked flask equipped with a thermometer and a dropping funnel was charged with 100 g of 2-butanone and purged with nitrogen gas for 30 minutes. After nitrogen purge, the content in the flask was heated to a temperature of 80° C. under stirring with a magnetic stirrer. The previously prepared monomer solution was added into the flask using a dropping funnel over three hours. The polymerization reaction was carried out for six hours after initiation of dropping. After the termination of the polymerization, the polymer solution was cooled with water to a temperature of 30° C. or lower and was poured into 2,000 g of methanol. Then a white precipitate was collected by filtration and the white powder in a state of slurry was washed twice with 400 g of methanol. After that, filtration and drying at a temperature of 50° C. for 17 hours were carried out to obtain a white powdery copolymer (73 g, yield: 73%).

Mw of the copolymer was 5,700 and the ratio Mw/Mn was 1.70. As a result of $^{13}$C-NMR analysis, the copolymer was found to have the repeating units (M-1), (M-2), and (M-4) in a ratio of 51.4:14.6:34.0 (% by mol), and the content of the repeating unit containing an acid-dissociable group was 48.6% by mol. The copolymer is referred to as a resin (α-2) for radiation-sensitive resin composition.

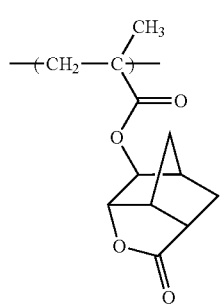
(M-1)

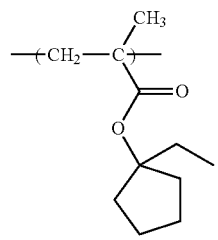
(M-2)

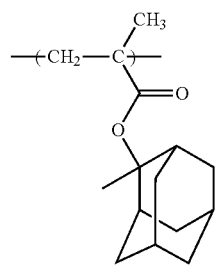
(M-4)

Synthesis Example 3

A monomer solution was prepared by dissolving 55.44 g (50% by mol) of a compound for forming the following repeating unit (M-1), 33.57 g (40% by mol) of a compound for forming the following repeating unit (M-5), and 10.99 g (10% by mol) of a compound for forming the following repeating unit (M-3) in 200 g of 2-butanone, and further adding 5.74 g of dimethyl-2,2'-azobis(2-methylpropionate). A 500 ml three-necked flask equipped with a thermometer and a dropping funnel was charged with 100 g of 2-butanone and purged with nitrogen gas for 30 minutes. After nitrogen purge, the content in the flask was heated to a temperature of 80° C. under stirring with a magnetic stirrer. The previously prepared monomer solution was added into the flask using a dropping funnel over three hours. The polymerization reaction was carried out for six hours after initiation of dropping. After the termination of the polymerization, the polymer solution was cooled with water to a temperature of 30° C. or lower and was poured into 2,000 g of methanol. Then a white precipitate was collected by filtration and the white powder in a state of slurry was washed twice with 400 g of methanol. After that, filtration and drying at a temperature of 50° C. for 17 hours were carried out to obtain a white powdery copolymer (72 g, yield: 72%).

Mw of the copolymer was 6,400 and the ratio Mw/Mn was 1.67. As a result of $^{13}$C-NMR analysis, the copolymer was found to have the repeating units (M-1), (M-5), and (M-3) in a ratio of 52.2:38.1:9.7 (% by mol), and the content of the repeating unit containing an acid-dissociable group was 38.1% by mol. The copolymer is referred to as a resin (α-3) for radiation-sensitive resin composition.

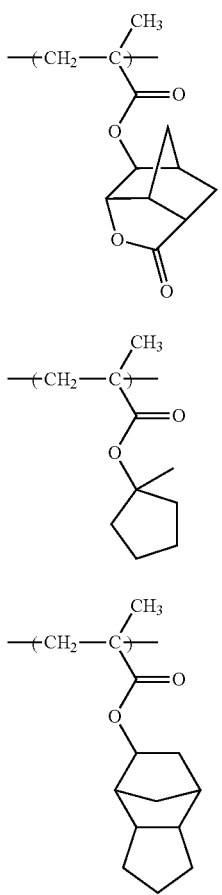

(1-2) Preparation of Radiation-Sensitive Resin Composition (α) to (γ)

Each of the resins (α-1) to (α-3) for radiation-sensitive resin composition synthesized as mentioned above, an acid generator (D), an acid diffusion controller (E), and a solvent (F) were mixed at proportions shown in Table 1, and the total solid content of each mixture was adjusted to the range from 0.2% to 20% by weight. The resulting solutions were filtered through a filter having a pore size of about 30 nm to prepare radiation-sensitive resin compositions (α) to (γ).

TABLE 1

| Radiation-sensitive resin composition | Resin | | Acid generator (D) | | Acid diffusion controller (E) | | Solvent (F) | |
|---|---|---|---|---|---|---|---|---|
| | Type | Part | Type | Part | Type | Part | Type | Part |
| (α) | α-1 | 30 | D-1 | 4 | E-1 | 0.83 | F-1 | 1710 |
| | α-2 | 70 | D-2 | 5 | | | F-2 | 730 |
| (β) | α-3 | 100 | D-3 | 6.5 | E-1 | 1.1 | F-1 | 1400 |
| | | | D-4 | 2 | | | F-2 | 600 |
| | | | | | | | F-3 | 30 |
| (γ) | α-1 | 100 | D-1 | 1.5 | E-1 | 0.65 | F-1 | 2400 |
| | | | D-2 | 6 | | | F-3 | 30 |

Details of components other than the resins (α-1) to (α-3) contained in the radiation-sensitive resin compositions (α) to (γ) shown in Table 1 are as follows.

[Acid Generator (D)]
(D-1): triphenylsulfonium nonafluoro-n-butanesulfonate
(D-2): 1-(4-n-butoxynaphthalen-1-yl)tetrahydrothiophenium nonafluoro-n-butanesulfonate
(D-3): triphenylsulfonium 2-(bicyclo[2.2.1]hept-2'-yl)-1,1,2,2-tetrafluoroethanesulfonate
(D-4): 1-(4-n-butoxynaphthyl)tetrahydrothiophenium 2-(bicyclo[2.2.1]hept-2'-yl)-1,1,2,2-tetrafluoroethanesulfonate
[Acid Diffusion Controller (E)]
(E-1): (R)-(+)-(tert-butoxycarbonyl)-2-piperidinemethanol
[Solvent (F)]
(F-1): propylene glycol mono methyl ether acetate
(F-2): cyclohexanone
(F-3): γ-butyrolactone

[2] Preparation of Composition for Forming Upper Layer Film in Liquid Immersion Lithography Resins (A-1) to (A-3), (B-1) and (C-1) capable of forming a film stably in water during irradiation and of being soluble in a developer used after resist pattern formation were synthesized for the resins (A), (B) and (C) by the following method.

(2-1) Synthesis of Resin (A)

Synthesis Example 4

50.0 g of 2-methacryloyloxyethyl hexahydrophthalate as a monomer for forming the repeating unit represented by the general formula (1-1) and 3.24 g of 2,2'-azobis(methyl 2-methylpropionate) as an initiator were dissolved in 50 g of isopropanol to prepare a monomer solution.

On the other hand, a 500 ml three-necked flask equipped with a thermometer and a dropping funnel was charged with 100 g of isopropanol and was purged with nitrogen gas for 30 minutes. After nitrogen purge, the content in the flask was heated to a temperature of 80° C. under stirring using a magnetic stirrer.

The previously prepared monomer solution was added into the flask using the dropping funnel over three hours. After the addition, the reaction was continued for a further three hours and the resultant reaction mixture was cooled to a temperature of 30° C. or lower to obtain a polymer solution. The polymer solution was poured into 2,400 g of water. The resulting precipitate was collected and was dried at room temperature under reduced pressure for 24 hours to obtain a resin powder. The resin powder was dissolved in 1,000 g of methanol. The solution was transferred to a separating funnel to purify with 2,000 g of n-hexane and 400 g of water. A lower layer solution was collected and was concentrated to 100 g. Then 4-methyl-2-pentanol was added to the concentrated solution for solvent replacement to obtain a resin solution. The solid content in the resin solution after solvent replacement with 4-methyl-2-pentanol was measured by putting 0.3 g of the resin solution on an aluminum dish, heating it on a hot plate at a temperature of 140° C. for one hour, weighing the weight of the resin solution before heating and the weight of the residue after heating. The resulting solid content was used for the preparation of an upper layer film forming composition solution and the calculation of the yield.

Mw of the resin contained in the resin solution was 9,760, the ratio Mw/Mn was 1.31, and the yield was 50%. This resin is referred to as "resin (A-1)".

The receding contact angle of the film formed from the resin (A-1) with water was less than 40°.

Synthesis Example 5

46.95 g (85% by mol) of 2-methacryloyloxyethyl hexahydrophthalate as a monomer for forming the repeating unit represented by the general formula (1-1) and 6.91 g of 2,2'- azobis(methyl-2-methylpropionate) as an initiator were dissolved in 100 g of isopropanol to prepare a monomer solution.

On the other and, a 500 ml three-necked flask equipped with a thermometer and a dropping funnel was charged with 50 g of isopropanol and was purged with nitrogen gas for 30 minutes. After nitrogen purge, the content in the flask was heated to a temperature of 80° C. under stirring using a magnetic stirrer.

The previously prepared monomer solution was added to the flask using the dropping funnel over two hours. After the addition, the reaction was continued for a further one hour. Then, 10 g of an isopropanol solution of 3.05 g (15% by mol) of vinyl sulfonic acid as a monomer for forming the repeating unit represented by the general formula (2-1) was added dropwise over 30 minutes. After that, the reaction was continued for a further one hour and the resultant reaction mixture was cooled to a temperature of 30° C. or lower to a copolymer solution.

The copolymer solution was concentrated to 150 g and was transferred to a separating funnel. Then, 50 g of methanol and 600 g of n-hexane were added into the separating funnel to separate and purify the copolymer. After the separation, the lower layer solution was collected. The lower layer solution was diluted with isopropanol to 100 g, which was again transferred to a separating funnel. After that, 50 g of methanol and 600 g of n-hexane were added into the separating funnel for purification. Then, separation was carried out and a lower layer solution was collected. 4-Methyl-2-pentanol was added to the collected lower layer solution for solvent replacement to adjust the total amount to 250 g. After the adjustment, 250 g of water was added for separation and purification, and an upper layer solution was collected. Then 4-methyl-2-pentanol was added to the collected upper layer solution for solvent replacement to obtain a resin solution. The solid content in the resin solution after solvent replacement with 4-methyl-2-pentanol was measured by putting 0.3 g of the resin solution on an aluminum dish, heating it on a hot plate at a temperature of 140° C. for one hour, weighing the weight of the resin solution before heating and the weight of the residue after heating. The resulting solid content was used for the preparation of an upper layer film forming composition solution and the calculation of the yield.

Mw of the resin contained in the resin solution was 11,060, the ratio Mw/Mn was 1.55, and the yield was 75%. The ratio of the repeating unit derived from 2-methacryloyloxyethyl hexahydrophthalate and the repeating unit derived from vinylsulfonic acid contained in the copolymer was 95:5 (% by mol). This copolymer is referred to as "resin (A-2)".

The receding contact angle with water of the film formed from the resin (A-2) was less than 40°.

Synthesis Example 6

48.15 g (95% by mol) of 2-methacryloyloxyethyl hexahydrophthalate and 1.85 g (5% by mol) of 2-acryloylamino-2-methyl-1-propanesulfonic acid as monomers for forming the repeating units represented by the formulae (1-1) and (2-2) and 3.28 g of 2,2'-azobis(methyl-2-methylpropionate) as an initiator were dissolved in 50 g of isopropanol to obtain a monomer solution.

On the other hand, a 500 ml three-necked flask equipped with a thermometer and a dropping funnel was charged with 100 g of isopropanol and was purged with nitrogen gas for 30 minutes. After nitrogen purge, the content in the flask was heated to a temperature of 80° C. under stirring using a magnetic stirrer.

The previously prepared monomer solution was added into the flask using the dropping funnel over three hours. After the addition, the reaction was continued for a further three hours and the resultant reaction mixture was cooled to a temperature of 30° C. or lower to obtain a polymer solution.

Subsequently, the polymer solution was poured into 2400 g of water. The resulting precipitate was collected and was dried at room temperature under reduced pressure for 24 hours to obtain a resin powder. The resin powder was dissolved in 1,000 g of methanol. The solution was transferred to a separating funnel to purify with 2,000 g of n-hexane and 400 g of water. A lower layer solution was collected and was concentrated to 100 g. Then 4-methyl-2-pentanol was added to the concentrated solution for solvent replacement to obtain a resin solution. The solid content in the resin solution after solvent replacement with 4-methyl-2-pentanol was measured by putting 0.3 g of the resin solution on an aluminum dish, heating it on a hot plate at a temperature of 140° C. for one hour, weighing the weight of the resin solution before heating and the weight of the residue after heating. The resulting solid content was used for the preparation of an upper layer film forming composition solution and the calculation of the yield.

Mw of the resin contained in the resin solution was 9,260, the ratio Mw/Mn was 1.35, and the yield was 30%. The ratio of the repeating unit derived from 2-methacryloyloxyethyl hexahydrophthalate and the repeating unit derived from 2-acryloylamino-2-methyl-1-propanesulfonic acid contained in the copolymer was 97:3 (% by mol). This copolymer is referred to as "resin (A-3)".

The receding contact angle of the film formed from the resin (A-3) with water was less than 40°.

(2-2) Synthesis of Resin (B)

Synthesis Example 7

46.95 g (85% by mol) of (1,1,1-trifluoro-2-trifluoromethyl-2-hydroxy-4-pentyl)methacrylate as a monomer for forming the repeating unit represented by the general formula (3-1) and 6.91 g of 2,2'-azobis(methyl 2-methylpropionate) as an initiator were dissolved in 100 g of isopropanol to obtain a monomer solution.

On the other hand, a 500 ml three-necked flask equipped with a thermometer and a dropping funnel was charged with 50 g of isopropanol and was purged with nitrogen gas for 30 minutes. After nitrogen purge, the content in the flask was heated to a temperature of 80° C. under stirring using a magnetic stirrer.

The previously prepared monomer solution was added to the flask using the dropping funnel over two hours. After the addition, the reaction was continued for a further one hour. Then, 10 g of an isopropanol solution containing 3.05 g (15% by mol) of vinyl sulfonic acid as a monomer for forming the repeating unit represented by the general formula (4) was added dropwise over 30 minutes. After that, the reaction was continued for a further one hour and the resultant reaction mixture was cooled to a temperature of 30° C. or lower to obtain a copolymer solution.

Subsequently, the copolymer solution was concentrated to 150 g and was transferred to a separating funnel. Then, 50 g of methanol and 600 g of n-hexane were added into the separating funnel to separate and purify the copolymer. After the separation, the lower layer solution was collected. The lower layer solution was diluted with isopropanol to 100 g, which was again transferred to a separating funnel. After that, 50 g of methanol and 600 g of n-hexane were added into the separating funnel for purification. Then, separation was carried out and a lower layer solution was collected. 4-Methyl-2-pentanol was added to the collected lower layer solution for solvent replacement to adjust the total amount to 250 g. After the adjustment, 250 g of water was added for separation and purification, and an upper layer solution was collected. Then 4-methyl-2-pentanol was added to the collected upper layer solution for solvent replacement to obtain a resin solution. The solid content in the resin solution after solvent replacement with 4-methyl-2-pentanol was measured by putting 0.3 g of the resin solution on an aluminum dish, heating it on a hot plate at a temperature of 140° C. for one hour, weighing the weight of the resin solution before heating and the weight of the residue after heating. The resulting solid content was used for the preparation of an upper layer film forming composition solution and the calculation of the yield.

Mw of the copolymer contained in the resin solution was 9,760, the ratio Mw/Mn was 1.51, and the yield was 65%. The ratio of the repeating unit derived from (1,1,1-trifluoro-2-trifluoromethyl-2-hydroxy-4-pentyl)methacrylate and the repeating unit derived from vinylsulfonic acid contained in the copolymer was 95:5 (% by mol). This copolymer is referred to as "resin (B-1)".

The receding contact angle with water of the film formed from the resin (B-1) was 69.0°.

(2-3) Synthesis of Resin (C)

Synthesis Example 8

A mixed solution was prepared by dissolving 25.0 g of 2,2-azobis(methyl 2-methyl-iso-propionate) in 25.0 g of methyl ethyl ketone.

On the other hand, a 2,000 ml three necked flask equipped with a thermometer and a dropping funnel was charged with 104.6 g of (1,1,1,3,3,3-hexafluoro-2-propyl)methacrylate, 195.4 g of (1,1,1-trifluoro-2-trifluoromethyl-2-hydroxy-4-pentyl)methacrylate, and 575.0 g of methyl ethyl ketone, and was purged with nitrogen gas for 30 minutes. After nitrogen purge, the content of the flask was heated to a temperature of 80° C. under stirring using a magnetic stirrer.

The previously prepared mixed solution was added into the flask using the dropping funnel over five minutes, followed by aging for 360 minutes. After that, the mixture was cooled to a temperature of 30° C. or lower to obtain a copolymer solution.

Subsequently, the copolymer solution was concentrated to 600 g and was transferred to a separating funnel. Then, 193 g of methanol and 1,542 g of n-hexane were added into the separating funnel to separate and purify the copolymer. After the separation, the lower layer solution was collected. 117 g of methyl ethyl ketone and 1,870 g of n-hexane were added to the lower layer solution to separate and further purify the copolymer. After the separation, the lower layer solution was again collected. And then 93 g of methanol, 77 g of methyl ethyl ketone, and 1,238 g of n-hexane were added to the lower layer solution to separate and still further purify the copolymer. After the separation, the lower layer solution was collected. 4-Methyl-2-pentanol was added to the collected lower layer solution for solvent replacement and the solution was washed with distilled water. Then, 4-methyl-2-pentanol was added again for solvent replacement to obtain a resin solution. The solid content in the resin solution after solvent replacement with 4-methyl-2-pentanol was measured by putting 0.3 g of the resin solution on an aluminum dish, heating it on a hot plate at a temperature of 140° C. for one hour, weighing the weight of the resin solution before heating and the weight of the residue after heating. The resulting solid content was used for the preparation of an upper layer film forming composition solution and the calculation of the yield.

Mw of the copolymer contained in the resin solution was 10,200, the ratio Mw/Mn was 1.65, and the yield was 65%. The ratio of the repeating unit derived from (1,1,1,3,3,3-hexafluoro-2-propyl)methacrylate and the repeating unit derived from (1,1,1-trifluoro-2-trifluoromethyl-2-hydroxy-4-pentyl)methacrylate contained in the copolymer was 39.5:60.5 (% by mol). This copolymer is referred to as "resin (C-1)".

The receding contact angle with water of the film formed from the resin (C-1) was 82.0°.

(2-4) Preparation of Composition for Forming Upper Layer Film in Liquid Immersion Lithography Example 1

A composition solution for forming an upper layer film of Example 1 with a solid content of 4% was prepared by mixing 20 parts of the resin (A-2) as a resin (A), 80 parts of the resin (B-1) as a resin (B), and 2,800 parts of 4-methyl-2-pentanol as a solvent (alcohol having 4 to 10 carbon atoms) ("Solvent (G-1)" in Table 2), followed by stirring for two hours and filtration through a filter having a pore size of 200 nm.

Examples 2 to 11 and Comparative Examples 1 to 4

Composition solutions for forming upper layer films of Examples 2 to 11 and Comparative Examples 1 to 4 were prepared in the same manner as in Example 1 except for using the radiation-sensitive resin composition, the resin (A), resin (B) and resin (C), and the solvent (G) at proportions shown in Table 2.

TABLE 2

| | Radiation-sensitive resin composition | Resin (A) | | Resin (B) | | Resin (C) | | Solvent (G) | |
|---|---|---|---|---|---|---|---|---|---|
| | | Type | Part | Type | Part | Type | Part | Type | Part |
| Example 1 | (α) | A-2 | 20 | B-1 | 80 | — | | G-1 | 2800 |
| Example 2 | (α) | A-3 | 20 | B-1 | 80 | — | | G-1 | 2800 |
| Example 3 | (α) | A-2 | 10 | B-1 | 90 | — | | G-1 | 2800 |
| Example 4 | (α) | A-2 | 50 | B-1 | 50 | — | | G-1 | 2800 |
| Example 5 | (α) | A-2 | 80 | B-1 | 20 | — | | G-1 | 2800 |
| Example 6 | (α) | A-2 | 20 | B-1 | 80 | — | | G-1 | 1680 |
| | | | | | | | | G-2 | 1120 |
| Example 7 | (α) | A-1 | 20 | B-1 | 80 | — | | G-1 | 2800 |
| Example 8 | (β) | A-2 | 20 | B-1 | 80 | — | | G-1 | 2800 |
| Example 9 | (γ) | A-2 | 20 | B-1 | 80 | — | | G-1 | 2800 |
| Example 10 | (α) | A-1 | 20 | B-1 | 77 | C-1 | 3 | G-1 | 1680 |
| | | | | | | | | G-2 | 1120 |
| Example 11 | (α) | A-1 | 20 | B-1 | 73 | C-1 | 7 | G-1 | 1993 |
| | | | | | | | | G-2 | 498 |
| Comparative Example 1 | (α) | — | | B-1 | 100 | — | | G-1 | 2800 |

TABLE 2-continued

| Radiation-sensitive resin composition | Resin (A) Type | Resin (A) Part | Resin (B) Type | Resin (B) Part | Resin (C) Type | Resin (C) Part | Solvent (G) Type | Solvent (G) Part |
|---|---|---|---|---|---|---|---|---|
| Comparative Example 2 | (α) | — | B-1 | 100 | — | | G-1 | 1680 |
| | | | | | | | G-2 | 1120 |
| Comparative Example 3 | (β) | — | B-1 | 100 | — | | G-1 | 2800 |
| Comparative Example 4 | (γ) | — | B-1 | 100 | — | | G-1 | 2800 |

[Solvent (G)]
(G-1): 4-methyl-2-pentanol
(G-2) Diisoamyl ether

[3] Performance Evaluation of Examples

The upper layer films obtained using the composition solutions prepared in the Examples and Comparative Examples were evaluated for the following items. The results are shown in Table 3.

(3-1) Upper Layer Film Removability

A coating (upper layer film) having a thickness of 90 nm was formed using "CLEAN TRACK ACT8" (type name) manufactured by Tokyo Electron limited on an 8-inch silicon wafer by spin-coating an upper layer film forming composition and baking at a temperature of 90° C. for 60 seconds. The thickness of the coating (film thickness) was measured with "LAMBDA ACE VM90" (type name) manufactured by Dainippon Screen Mfg. Co., Ltd.

After that, paddle development (developer: 2.38% aqueous solution of TMAH (tetramethylammonium hydroxide)) was carried out for 60 seconds using "CLEAN TRACK ACT8" (type name). Then, the wafer was dried by spinning to observe the surface. When the development was complete with no residues being observed, the removability was judged to be "Good". When a residue was observed, the removability was judged to be "Bad".

(3-2) Measurement of Receding Contact Angle

A coating (upper layer film) having a thickness of 90 nm was formed on an 8-inch silicon wafer by spin-coating an upper layer film forming composition and PB at a temperature of 90° C. for 60 seconds. Promptly after formation, the receding contact angle was measured with "DSA-10" (type name) manufactured by KRUS according to the following procedure at a room temperature of 23° C. and humidity of 45% under atmospheric pressure.

After adjusting the wafer stage position of "DSA-10" (type name) manufactured by KRUS, the above wafer was set on the stage. A needle of the analyzer was filled with water, and its initial position was minutely adjusted so that water drops could be formed on the wafer. After forming a 25 μl water drop on the wafer by discharging water from the needle, the needle was once withdrawn from the water drop and again returned to the initial position to dispose the needle in the water drop. Then, the water drop was suctioned at a rate of 10 μl/min for 90 seconds using the needle, while measuring the receding contact angle once every second (90 times in total). An average of contact angles measured in 20 seconds from the time when the measured value stabilized was calculated, and the result was taken as the receding contact angle.

(3-3) Intermixing

The capability of upper layer films to prevent intermixing was evaluated.

A radiation-sensitive resin composition (a) was spin-coated on an 8-inch silicon wafer which was previously treated with HMDS (100° C., 60 seconds) using "CLEAN TRACK ACT8" (type name). The coating was baked (PB) on a hot plate at a temperature of 90° C. for 60 seconds to form a photoresist film having a thickness of 120 nm. An upper layer film forming composition was spin-coated on the photoresist film and PB at a temperature of 90° C. for 60 seconds to form a film (upper layer film) having a thickness of 90 nm. The film was dried by spinning at 4,000 rpm for 15 seconds while injecting ultra-pure water onto the wafer from a rinse nozzle of the "CLEAN TRACK ACT8" (type name).

The upper layer film was removed using "CLEAN TRACK ACT8" (type name) by paddle development (developer: 2.38% TMAH aqueous solution) using an LD nozzle for 60 seconds. Although the upper layer film was removed by the development, the photoresist film which was not exposed remained as it is.

The thickness of the photoresist film was measured before and after the development using "LAMBDA ACE VM90" (type name) manufactured by Dainippon Screen Mfg. Co., Ltd. When the thickness change was within 5%, it was judged that there was no intermixing between the photoresist film and the upper layer film and the intermixing was evaluated as "Good". When the thickness change was more than 5%, the intermixing was evaluated as "Bad".

(3-4) Amount of Elution

Figure 2:
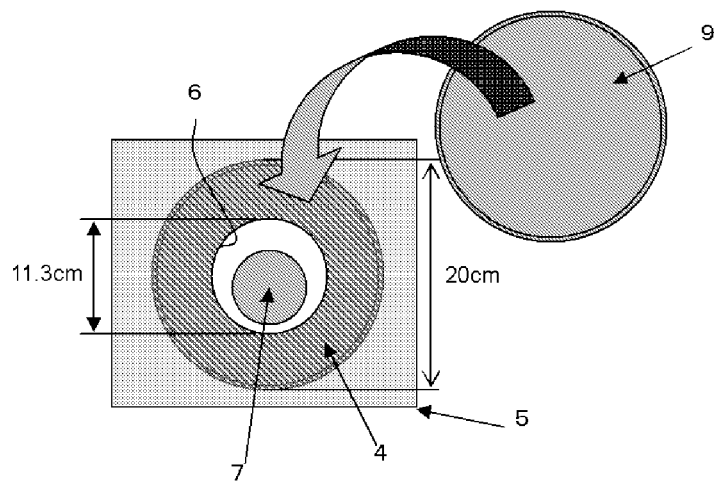
FIG. 2 is an explanatory view schematically showing the manner of placing an 8-inch silicon wafer on a silicone rubber sheet so as to prevent leakage of ultra-pure water in the measurement of the amount of elution from the upper layer film formed from the composition for forming an upper layer film of the embodiment of the present invention.
Figure 3:
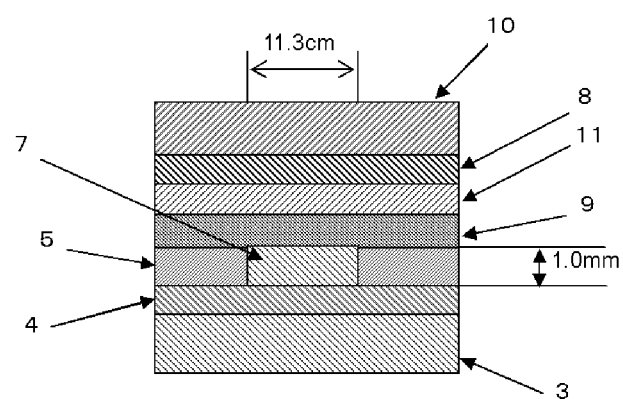
FIG. 3 is a cross-sectional view showing measurement of the amount of elution from the upper layer film formed from the composition for forming an upper layer film of the embodiment of the present invention.

An 8-inch silicon wafer was previously treated with HMDS (hexamethyldisilazane) using "CLEAN TRACK ACT8" (type name) manufactured by Tokyo Electron limited at a temperature of 100° C. for 60 seconds to provide an 8-inch silicon wafer 3 having an HMDS-treated layer 4 as shown in FIGS. 2 and 3. A silicone rubber sheet 5 in the shape of a square (thickness: 1.0 mm, 30 cm×30 cm) with the center cut out in a circle of diameter, 11.3 cm, manufactured by Kureha Elastomer Co., Ltd. was placed on the side of the HMDS-treated layer 4 of the 8-inch silicon wafer 3. In this instance, the center cut-out portion 6 of the silicone rubber sheet 5 was positioned at the center of the 8-inch silicon wafer 3. Next, the cut-out portion 6 of the silicone rubber sheet 5 was filled with 10 ml of ultra-pure water 7 using a 10 ml transfer pipette.

Separately from the above-mentioned 8-inch silicon wafer 3, another 8-inch silicon wafer 10 having a pre-formed lower layer antireflection film 8, resist film 11, and upper layer film 9 was prepared. This 8-inch silicon wafer 10 was placed on the 8-inch silicon wafer 3 so that the upper layer film 9 was on the side of the silicone rubber sheet 5, that is to say, in such a manner that the upper layer film 9 and the ultra-pure water 7 were caused to come in contact so that there was no leakage of the ultra-pure water 7.

The above lower layer antireflection film 8, resist film 11, and upper layer film 9 on the 8-inch silicon wafer 10 were formed as follows.

First, a composition for forming a lower layer antireflection film (trade name "ARC29A", manufactured by Brewer Science, Inc.) was applied using the above-mentioned "CLEAN TRACK ACT8" so that a lower layer antireflection film having a thickness of 77 nm was formed. Next, the above-mentioned radiation-sensitive resin composition (a) was spin-coated on the lower layer antireflection film and baked at a temperature of 115° C. for 60 seconds using the above-mentioned "CLEAN TRACK ACT8" to form a resist film 11 having a thickness of 205 nm. After that, the above-mentioned composition for forming upper layer film was applied to the resist film 11 to form an upper layer film 9.

The upper layer film 9 and the silicone rubber sheet 5 were maintained for 10 seconds in the same position after the former was placed on the latter. After this, the 8-inch silicon wafer 10 was removed and the ultra-pure water 7 which was in contact with the upper layer film 9 was collected using a glass pipette for use as a sample for analysis. The recovery rate of the ultra-pure water 7 which had been filled in the cut-out portion 6 of the silicone rubber sheet 5 was 95% or more.

Subsequently, the collected sample for analysis (ultra-pure water) was subjected to a measurement of LC-MS using a liquid chromatograph mass spectrometer having "SERIES 1100" manufactured by AGILENT Corp. for LC section, and "Mariner" manufactured by Perspective Biosystems, Inc. for MS section under the following conditions to obtain the peak intensity of an anion part of the acid generator. In this instance, peak intensities of the aqueous solutions containing the radiation-sensitive acid generator used for the radiation-sensitive resin composition (a) at concentrations of 1 ppb, 10 ppb, and 100 ppb were measured under the same conditions as the sample for analysis to prepare a calibration curve. The eluted amount was calculated from the above peak intensity using this calibration curve. In the same manner, the peak intensities of aqueous solutions of the acid diffusion controller at concentrations of 1 ppb, 10 ppb, and 100 ppb were measured under the same conditions as the sample for analysis to prepare a calibration curve. The eluted amount of the acid diffusion controller was calculated from the above peak intensity using this calibration curve.

The elution amount was evaluated as "Bad" when the sum of the elution amount of the anion part of the photoacid generator and the elution amount of the acid diffusion controller calculated as mentioned above was $5.0 \times 10^{-12}$ mol/cm$^2$ or more, and as "Good" when that sum was less than $5.0 \times 10^{-12}$ mol/cm$^2$.

<Measurement Conditions>
Column: One column of "CAPCELL PAK MG" manufactured by Shiseido Co., Ltd.
Flow rate: 0.2 ml/min
Solvent: A 3:7 mixture of water and methanol with 0.1% of formic acid added.
Measurement temperature: 35° C.

(3-5) Blob Defect

An 8-inch silicon wafer was previously treated with HMDS (hexamethyldisilazane) using "CLEAN TRACK ACT8" (type name) manufactured by Tokyo Electron limited at a temperature of 100° C. for 60 seconds. A coating having a thickness of 120 nm was formed on an 8-inch silicon wafer by spin-coating the above-mentioned radiation-sensitive resin composition (α) and baking (PB) on a hot plate at a temperature of 90° C. for 60 seconds. A coating (upper layer film) having a thickness of 90 nm was formed on the resulting coating by spin-coating the above-mentioned composition for forming an upper layer film and baking (PB) at a temperature of 90° C. for 60 seconds or at 110° C. for 60 seconds. Then, the 8-inch silicon wafer was exposed through a grinding glass with no pattern formed thereon. The resulting 8-inch silicon wafer was used for evaluation of blob defect.

First, ultra-pure water was injected for 60 seconds from a rinse nozzle of "CLEAN TRACK ACT8" onto the upper layer film of the 8-inch silicon wafer and dried by spinning at 4,000 rpm for 15 seconds. Next, the upper layer film was removed using the above-mentioned "CLEAN TRACK ACT8" by paddle development using an LD nozzle for 60 seconds. A 2.38% TMAH aqueous solution was used as a developer for the paddle development.

The amount of dissolution residue of the upper layer film after development was measured with "KLA2351" manufactured by KLA-Tencor Corp. for the blob defect. When the number of detected development peel defects (blob defect) was 200 or less, the blob defect was evaluated as "Good". When the number of detected development peel defects (blob defects) was more than 200, the blob defect was evaluated as "Bad".

(3-6) Patterning

The capability of high resolution resist pattern formation was evaluated as follows.

First, a composition for forming a lower layer antireflection film (trade name "ARC29A", manufactured by Brewer Science, Inc.) was spin-coated on an 8-inch silicon wafer using the "CLEAN TRACK ACT8" and baked at a temperature of 205° C. for 60 seconds to form a coating (lower layer antireflection film) having a thickness of 77 nm. Then, the radiation-sensitive resin composition (a) was spin-coated on the lower layer antireflection film and baked (PB) at a temperature of 90° C. for 60 seconds to form a coating (photoresist film) having a thickness of 120 nm.

Next, a coating (upper layer film) having a thickness of 90 nm was formed on the resulting photoresist film by spin-coating the composition for forming an upper layer film and baking (PB) at a temperature of 90° C. for 60 seconds or at 110° C. for 60 seconds. After that, exposure was carried out under optical conditions of NA of 0.78, sigma of 0.85, and 2/3Ann using an ArF projection aligner "S306C" (type name) manufactured by Nikon Corp. Then, ultra-pure water was injected to the wafer from a rinse nozzle of the "CLEAN TRACK ACT8" (type name) and was dried by spinning at 4,000 rpm for 15 seconds. A hot plate in the "CLEAN TRACK ACT8" (type name) was used for PEB at a temperature of 105° C. for 60 seconds, and then paddle development (developer: 2.38% TMAH aqueous solution) was carried out for 30 seconds using an LD nozzle. Subsequently, ultra-pure water was used for rinsing and drying was carried out spinning at 4,000 rpm for 15 seconds. The amount of light at which a 1:1 line-and-space pattern (1L1S) having a line width of 90 nm was formed through the resulting resist pattern was taken as an optimum dose. For the measurement, a scanning electron microscope "S-9380" (type name) manufactured by Hitachi High-Tech Fielding Corp. was used.

The cross-sectional form of the 90 nm line-and-space pattern was observed using a scanning electron microscope "S-4200" (type name) manufactured by Hitachi High-Tech Fielding Corp. FIG. 1 is a cross-sectional view schematically showing the line-and-space pattern.

A line width Lb in the middle of the film of a pattern 2 formed on a substrate 1 and a line width La on the upper part of the film were measured. The patterning was judged as "Good" when $0.9 \leq La/Lb \leq 1.1$ and as "Bad" when $La/Lb < 0.9$ or when $La/Lb > 1.1$.

(3-7) Dissolution Residue Defect

An 8-inch silicon wafer was previously treated with HMDS (hexamethyldisilazane) using "CLEAN TRACK ACT8" (type name) manufactured by Tokyo Electron limited at a temperature of 100° C. for 60 seconds. The above-mentioned radiation-sensitive resin composition (α) was spin-coated on the 8-inch silicon wafer and baking (PB) was carried out using a hot plate at a temperature of 100° C. for 60 seconds to form a coating having a thickness of 120 nm. Then, the above-mentioned composition for forming an upper layer film was spin-coated onto the resulting coating and baking (PB) was carried out at a temperature of 90° C. for 60 seconds or at 110° C. for 60 seconds to form a coating having a thickness of 90 nm. After that, exposure was carried out under optical conditions of NA of 0.78, sigma of 0.85, and 2/3Ann using an ArF projection aligner "S306C" (type name) manufactured by Nikon Corp. Then, ultra-pure water was injected to the wafer from a rinse nozzle of the "CLEAN TRACK ACT8" (type name) and was dried by spinning at 4,000 rpm for 15 seconds. A hot plate in the "CLEAN TRACK ACT8" (type name) was used for PEB at a temperature of 105° C. for 60 seconds, and then paddle development (developer: 2.38% TMAH aqueous solution) was carried out for 30 seconds using an LD nozzle. Subsequently, ultra-pure water was used for rinsing and drying was carried out spinning at 4,000 rpm for 15 seconds. A 160 nm space/3,600 nm pitch trench pattern was formed on the resulting 8-inch silicon wafer to evaluate dissolution defect.

The number of dissolution defects was measured with "KLA2351" manufactured by KLA-Tencor Corp. When the number of detected defects was 10 or less, dissolution defect was evaluated as "Good", and when it was more than 10, dissolution defect was evaluated as "Bad".

(3-8) Watermark Defect 12-inch silicon wafer with an under layer antireflection film having a thickness of 77 nm ("ARC29A", manufactured by Brewer Science, Inc.) was used as a substrate. For the formation of the under layer antireflection film, "CLEAN TRACK ACT 12" (type name) manufactured by Tokyo Electron Limited was used.

A radiation-sensitive resin composition was spin-coated onto the above-mentioned substrate using the "CLEAN TRACK ACT12" and then baking (PB) was carried out at a temperature of 115° C. for 60 seconds to form a photoresist film having a thickness of 120 nm. After that, a solution of the composition for forming an upper layer film was spin-coated on the photoresist film and baking (PB) was carried out at a temperature of 90° C. for 60 seconds to form a coating (upper layer film) having a thickness of 90 nm. Next, the upper layer film was exposed through a mask pattern using an ArF excimer laser liquid immersion lithographic machine "ASML AT1250i" manufactured by ASML under annular illumination conditions of NA=0.85 and $\sigma_0/\sigma_1$=0.96/0.76. Pure water was used as an immersion liquid medium between the upper side of the resist (photoresist film) and the lens of the liquid immersion lithographic machine. After that, baking (PB) was carried out at a temperature of 115° C. for 60 seconds and development was carried out in a 2.38% TMAH aqueous solution at a temperature of 23° C. for 60 seconds. Then, a positive-tone resist pattern was formed by washing with water, and drying. In this instance, a dose required for forming a 1:1 line-and-space pattern (1L1S) having a line width of 100 nm was regarded as an optimum exposure dose, which was taken as the sensitivity. For the measurement, a scanning electron microscope "S-9380" (type name) manufactured by Hitachi High-Tech Fielding Corp. was used.

A defect on a line-and-space pattern (1L1S) having a line width of 100 nm was measured with "KLA2351" manufactured by KLA-Tencor Corp. Specifically, watermark defects by the "KLA2351" were confirmed by inspecting detected defects using a scanning electron microscope "S-9380" (type name) manufactured by Hitachi High-Tech Fielding Corp. When the number was 5 or less, the watermark defect was evaluated as "Good" and when it was more than 5, watermark defect was evaluated as "Bad".

TABLE 3

| | Upper layer film removability | Receding contact angle | Intermixing | Elution amount | Blob defect PB temperature for upper layer film 90° C. | Blob defect PB temperature for upper layer film 110° C. | Patterning PB temperature for upper layer film 90° C. | Patterning PB temperature for upper layer film 110° C. | Dissolution defect PB temperature for upper layer film 90° C. | Dissolution defect PB temperature for upper layer film 110° C. | Watermark |
|---|---|---|---|---|---|---|---|---|---|---|---|
| Example 1 | Good | 69.0 | Good | Good | Good | Good | Good | Good | Good | Good | Good |
| Example 2 | Good | 69.0 | Good | Good | Good | Good | Good | Good | Good | Good | Good |
| Example 3 | Good | 69.0 | Good | Good | Good | Good | Good | Good | Good | Good | Good |
| Example 4 | Good | 69.0 | Good | Good | Good | Good | Good | Good | Good | Good | Good |
| Example 5 | Good | 55.0 | Good | Good | Good | Good | Good | Good | Good | Good | Good |
| Example 6 | Good | 69.0 | Good | Good | Good | Good | Good | Good | Good | Good | Good |
| Example 7 | Good | 69.0 | Good | Good | Good | Good | Good | Good | Good | Good | Good |
| Example 8 | Good | 69.0 | Good | Good | Good | Good | Good | Good | Good | Good | Good |
| Example 9 | Good | 69.0 | Good | Good | Good | Good | Good | Good | Good | Good | Good |
| Example 10 | Good | 72.0 | Good | Good | Good | Good | Good | Good | Good | Good | Good |
| Example 11 | Good | 74.0 | Good | Good | Good | Good | Good | Good | Good | Good | Good |
| Comparative Example 1 | Good | 69.0 | Good | Good | Good | Good | Good | Good | Bad | Bad | Good |
| Comparative Example 2 | Good | 69.0 | Good | Good | Good | Good | Good | Good | Bad | Bad | Good |
| Comparative Example 3 | Good | 69.0 | Good | Good | Good | Good | Good | Good | Bad | Bad | Good |
| Comparative Example 4 | Good | 69.0 | Good | Good | Good | Good | Good | Good | Bad | Bad | Good |

As shown in Table 3, the upper layer films obtained by the compositions for an upper layer film according to Examples 1 to 11 exhibited "Good" results in removability evaluation, the receding contact angle of 69° to 74°, and "Good" results in intermixing evaluation, elution evaluation, blob defect evaluation, patterning evaluation, dissolution defect evaluation, and watermark defect evaluation.

In addition, these upper layer film forming compositions according to Examples 1 to 11 were confirmed to have improved dissolution residue defect as compared with the upper layer film forming compositions according to Comparative Examples 1 to 4.

The present invention is not limited to the specific embodiments described above. Various alterations according to the object and applications within the scope of the present invention are possible.

In addition, the following upper layer film forming compositions and upper layer films in liquid immersion lithography are included in such alterations.

[1] A composition for forming an upper layer film in liquid immersion lithography which includes a resin component and a solvent, and is characterized in that the resin component includes a resin (A) having at least one repeating unit selected from a repeating unit represented by the following formula (1-1), a repeating unit represented by the following formula (1-2), and a repeating unit represented by the following formula (1-3) and forming a film having a receding contact angle with water of less than 60°.

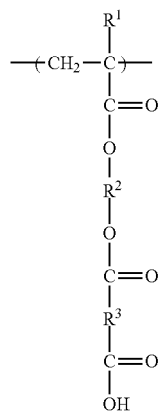
(1-1)

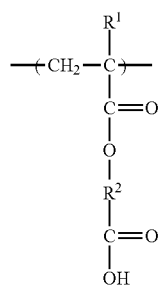
(1-2)

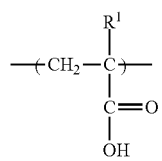
(1-3)

(In the general formulae (1-1) to (1-3), $R^1$ individually is a hydrogen atom or a methyl group, $R^2$ and $R^3$ individually are a methylene group, a linear or branched alkylene group having 2 to 6 carbon atoms, or an alicyclic alkylene group having 4 to 12 carbon atoms.)

[2] The composition for forming an upper layer film in liquid immersion lithography according to [1] above, wherein the resin (A) includes at least one repeating unit selected from a repeating unit represented by the following general formula (2-1) and a repeating unit represented by the following general formula (2-2).

(2-1)

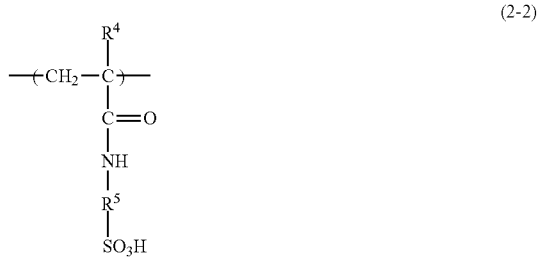
(2-2)

(In the general formulae (2-1) and (2-2), $R^4$ individually is a hydrogen atom or a methyl group, and $R^5$ individually is a single bond, a methylene group, or a linear or branched alkylene group having 2 to 6 carbon atoms.)

[3] The composition for forming an upper layer film in liquid immersion lithography according to [1] or [2] above, wherein the resin component further includes a resin (B) having at least one repeating unit selected from a repeating unit represented by the following formula (3-1), a repeating unit represented by the following formula (3-2), and a repeating unit represented by the following formula (3-3), and a repeating unit represented by the following formula (4), the resin (B) forming a film having a receding contact angle with water of 65° or more.

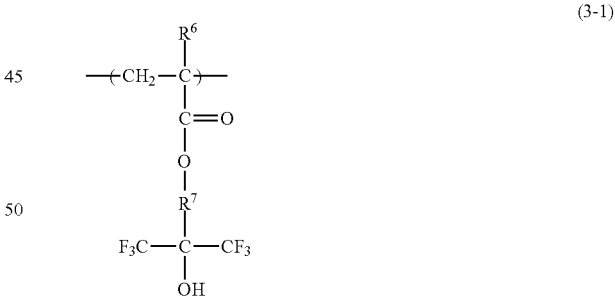
(3-1)

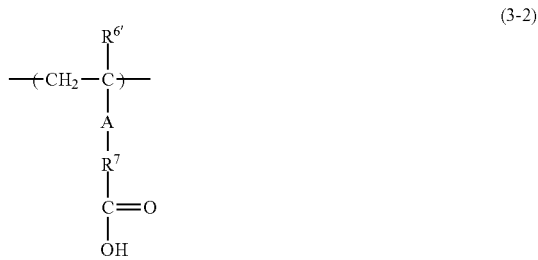
(3-2)

-continued

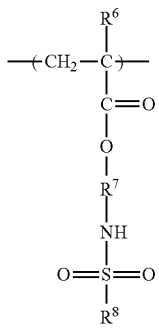
(3-3)

(In the general formulae (3-1) to (3-3), $R^6$ individually is a hydrogen atom, a methyl group, or a trifluoromethyl group, $R^{6'}$ is a linear or branched alkyl group having 1 to 3 carbon atoms with at least one hydrogen atom being substituted by a fluorine atom, $R^7$ individually is a single bond, a methylene group, a linear or branched alkylene group having 2 to 6 carbon atoms, or an alicyclic alkylene group having 4 to 12 carbon atoms, $R^8$ is a linear or branched alkyl group having 1 to 10 carbon atoms with at least one hydrogen atom being substituted by a fluorine atom or an alicyclic alkyl group having 3 to 10 carbon atoms with at least one hydrogen atom being substituted by a fluorine atom, and A represents a single bond, a carbonyl group, a carbonyloxy group, or an oxycarbonyl group.)

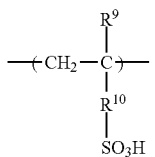
(4)

(In the general formula (4), $R^9$ is a hydrogen atom, a methyl group, or a trifluoromethyl group, and $R^{10}$ is a single bond, a methylene group, or a linear or branched alkylene group having 2 to 6 carbon atoms.)

[4] The composition for forming an upper layer film in liquid immersion lithography according to any one of [1] to [3] above, wherein the content of the resin (A) is in the range from 5% to 70% by weight based on 100% by weight of the total of the resin component.

Since the composition for forming an upper layer film of the embodiment of the present invention contains the resin (A) as a resin component, a photoresist film can be protected during liquid immersion lithography, a stable film can be maintained without eluting its components in a medium such as water, defects such as watermark defects and pattern defects can be effectively suppressed, a resist pattern can be formed having a high resolution, and an upper layer film can be formed having a sufficiently high receding contact angle. The upper layer film can effectively suppress defects such as watermark defects in the formation of resist patterns at a high scanning speed in the future. Therefore, the composition for forming an upper layer film of the embodiment of the present invention can form an upper layer film which can be suitably used in liquid immersion lithography and can be suitably used when manufacturing semiconductor devices which are expected to become increasingly miniaturized in the future.

Obviously, numerous modifications and variations of the present invention are possible in light of the above teachings. It is therefore to be understood that within the scope of the appended claims, the invention may be practiced otherwise than as specifically described herein.

The invention claimed is:

1. A composition for forming an upper layer film in liquid immersion lithography, comprising:
    a solvent; and
    a resin component comprising;
        a first resin having a first repeating unit and a second repeating unit, the first repeating unit being a repeating unit represented by a formula (1-1), a repeating unit represented by a formula (1-2), a repeating unit represented by a formula (1-3), or a combination thereof, the second repeating unit being a repeating unit represented by a formula (2-1), a repeating unit represented by a formula (2-2), or both thereof; and
        a second resin having a third repeating unit and a fourth repeating unit, the third repeating unit being a repeating unit represented by a formula (3-1), a repeating unit represented by a formula (3-2), a repeating unit represented by a formula (3-3), or a combination thereof, the fourth repeating unit being a repeating unit represented by a formula (4), a film formed by the second resin having a receding contact angle with water of 65° or more,

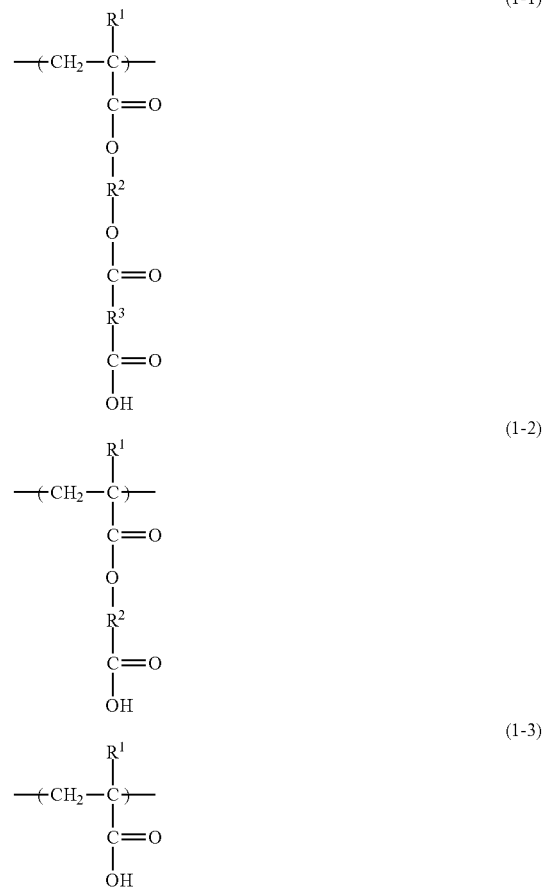

wherein, in the formulae (1-1) to (1-3), each $R^1$ individually is a hydrogen atom or a methyl group, each of $R^2$ and $R^3$ individually is a methylene group, a linear or branched alkylene group having 2 to 6 carbon atoms, or an alicyclic alkylene group having 4 to 12 carbon atoms,

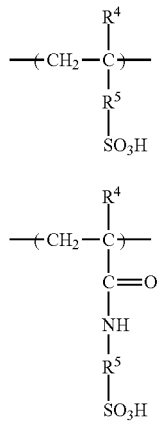

(2-1)

(2-2)

wherein, in the formulae (2-1) and (2-2), each $R^4$ individually is a hydrogen atom or a methyl group, and each $R^5$ individually is a single bond, a methylene group, or a linear or branched alkylene group having 2 to 6 carbon atoms,

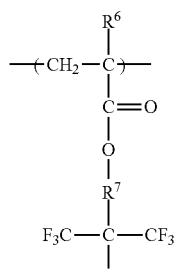

(3-1)

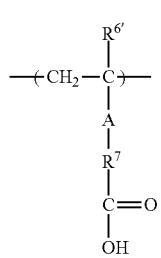

(3-2)

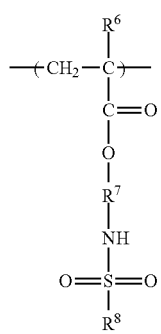

(3-3)

wherein, in the formulae (3-1) to (3-3), each $R^6$ individually is a hydrogen atom, a methyl group, or a trifluoromethyl group, $R^{6'}$ is a linear or branched alkyl group having 1 to 3 carbon atoms with at least one hydrogen atom being substituted by a fluorine atom, each $R^7$ individually is a single bond, a methylene group, a linear or branched alkylene group having 2 to 6 carbon atoms, or an alicyclic alkylene group having 4 to 12 carbon atoms, $R^8$ is a linear or branched alkyl group having 1 to 10 carbon atoms with at least one hydrogen atom being substituted by a fluorine atom or an alicyclic alkyl group having 3 to 10 carbon atoms with at least one hydrogen atom being substituted by a fluorine atom, and A represents a single bond, a carbonyl group, a carbonyloxy group, or an oxycarbonyl group,

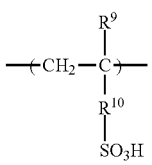

(4)

wherein, in the formula (4), $R^9$ is a hydrogen atom, a methyl group, or a trifluoromethyl group, and $R^{10}$ is a single bond, a methylene group, or a linear or branched alkylene group having 2 to 6 carbon atoms.

2. The composition according to claim 1, wherein a film formed by the first resin has a receding contact angle with water of less than 60°.

3. The composition according to claim 1, wherein a content of the first resin is in a range from 5% to 70% by weight based on 100% by weight of a total of the resin component.

4. An upper layer film in liquid immersion lithography, the upper layer film being formed using the composition according to claim 1.

5. A method for forming a photoresist pattern, comprising:
applying a photoresist composition to a substrate to form a photoresist film;
applying the composition according to claim 1 to the photoresist film to form an upper layer film;
disposing a liquid immersion medium between the upper layer film and a lens;
irradiating the photoresist film and the upper layer film with exposure light through the liquid immersion medium and a mask having a specific pattern; and
developing the photoresist film to obtain a photoresist pattern.

6. The composition according to claim 1, wherein the second repeating unit is a repeating unit represented by a formula (2-2).

* * * * *